United States Patent
Norris et al.

(10) Patent No.: US 7,831,892 B2
(45) Date of Patent: *Nov. 9, 2010

(54) GENERIC, REDUCED STATE, MAXIMUM LIKELIHOOD DECODER

(75) Inventors: James A. Norris, Fairport, NY (US); John W. Nieto, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 964 days.

This patent is subject to a terminal disclaimer.

(21) Appl. No.: 11/625,305

(22) Filed: Jan. 20, 2007

(65) Prior Publication Data

US 2008/0178063 A1 Jul. 24, 2008

(51) Int. Cl.
*H03M 13/03* (2006.01)

(52) U.S. Cl. .................. 714/786; 375/265; 375/340

(58) Field of Classification Search .............. 375/259, 375/265, 262, 231, 341, 346, 233; 714/786, 714/796, 794
See application file for complete search history.

(56) References Cited

U.S. PATENT DOCUMENTS

| | | | | |
|---|---|---|---|---|
| 4,462,101 A | 7/1984 | Yasuda et al. | ............... | 371/43 |
| 5,446,758 A | 8/1995 | Eyuboglu | ............... | 375/259 |
| 5,455,839 A | 10/1995 | Eyuboglu | ............... | 375/265 |
| 6,026,121 A | 2/2000 | Sadjadpour | ............... | 375/262 |
| 6,044,111 A | 3/2000 | Meyer et al. | ............... | 375/231 |
| 6,081,562 A | 6/2000 | He et al. | ............... | 375/341 |
| 6,154,507 A * | 11/2000 | Bottomley | ............... | 375/340 |
| 6,690,754 B1 | 2/2004 | Haratsch et al. | ............... | 375/346 |
| 7,000,175 B2 | 2/2006 | Azadet et al. | ............... | 714/794 |
| 7,042,938 B2 | 5/2006 | Malkov et al. | ............... | 375/233 |
| 7,502,418 B2 * | 3/2009 | Azadet et al. | ............... | 375/265 |
| 2005/0268211 A1 | 12/2005 | Haratsch | ............... | 714/796 |
| 2006/0039492 A1 | 2/2006 | Azadet et al. | ............... | 375/262 |
| 2006/0068709 A1 | 3/2006 | Hafeez | ............... | 455/63.1 |

FOREIGN PATENT DOCUMENTS

WO 2006/026334 3/2006

OTHER PUBLICATIONS

Eyuboglu et al., "Reduced-State Sequence Estimation with Set Partitioning and Decision Feedback," IEEE Transactions on Communications, vol. 36, No. 1, Jan. 1988, pp. 13-20.

(Continued)

*Primary Examiner*—Sam Rizk
(74) *Attorney, Agent, or Firm*—Allen, Dyer, Doppelt, Milbrath & Gilchrist, P.A.

(57) ABSTRACT

A decoder includes at least one programming input for a plurality of programmable reduced-state trellis parameters. A programmable device is connected to the at least one programming input and implements a reduced-state maximum likelihood decoder that is operable for processing a continuous phase modulated (CPM) signal and returning up to N bits that were transmitted based on a maximum likelihood and current winning super-state and corresponding survivor full-state. The programmable device calculates the path metrics for every super-state and determines a best path based on the reduced-state trellis parameters.

28 Claims, 12 Drawing Sheets

OTHER PUBLICATIONS

Svensson, "*Reduced State Sequence Detection of Full Response Continuous Phase Modulation*," Electronics Letters, vol. 26, No. 10, May 10, 1990, pp. 652-654.

Norris, "*Performance of MIL-STD-188-181C CPM SATCOM with Reduced State Demodulation*," IEEE Military Communications Conference, Oct. 23-25, 2006, pp. 1-4.

Hocevar et al,, "*Achieving Flexibility in a Viterbi Decoder DSP Coprocessor*," IEEE Vehicular Technology Conference, vol. 5, Sep. 24-28, 2000, pp. 2257-2264.

Chadha et al., "*A Reconfigurable Viterbi Decoder Architecture*," The 35$^{th}$ IEEE Asilomar Conference on Signals, Systems & Computers, vol. 1 of 2, Conf. 35, Nov. 4-7, 2001, pp. 66-71.

\* cited by examiner h=1/4 CPFSK TRELLIS

BER COMPARISON OF MIL-STD-188-181C
h={4/16, 5/16} 4-ARY CPFSK TO SET-PARTITIONING
REDUCED-STATE MODEL.

THE 4-STATE TRELLIS STRUCTURE

BER COMPARISON OF MIL-STD-188-181C
h={ 4/16, 5/16 } 4-ary CPFSK WITH TILTED-PHASE
REDUCED-STATE MODEL

PM PULSE SHAPE PERFORMANCE

REDUCED STATE h=1/3 AMPLITUDE SHAPED HCPM BIT ERROR RATE

GENERIC, REDUCED STATE, MAXIMUM LIKELIHOOD DECODER

FIELD OF THE INVENTION

The present invention relates to communication systems, and more particularly, this invention relates to maximum likelihood decoding used in communication systems.

BACKGROUND OF THE INVENTION

An error correction and detection system used in communication systems detects errors due to noise or other signal impairments during transmission to enable error localization and error correction. Forward error correction (FEC) permits error control for data transmission, and differs from standard error detection and correction systems because the receiver can correct errors without requesting a retransmission of data. The design of the code used in any FEC system determines the maximum fraction of errors that can be corrected in advance. As a result, different FEC codes can be suitable for different conditions.

For example, in many FEC schemes, redundancy is added to transmitted data using a predetermined algorithm. Each of the redundant bits is a complex function of the original information bits. As a result, the encoded output may or may not include the original information. Unmodified inputs at the output are systematic codes and those that are not are non-systematic.

FEC schemes could be considered to average the noise because each data bit affects many transmitted symbols. Some symbols are corrupted more by noise than others and this allows the original data to be extracted from the other, less corrupted received signals that depend on the same user data. As FEC codes approach the theoretical Shannon limit and stronger codes are used, an FEC scheme works well above a minimum signal-to-noise ratio, but typically fails when the signal is below that minimum ratio.

For higher modem data rates, for example, greater than 1 Mbps, the computational complexity of FEC schemes can be prohibitive given the current state of commercially available digital signal processors (DSPs) and Field Programmable Gate Array (FPGA) technology.

The use of Forward Error Correction (FEC) and the Maximum Likelihood Decoder (e.g. Viterbi Algorithm) are described exhaustively in most standard communications texts including "Digital Communications" by John G. Proakis. Continuous Phase Modulation is described in detail in books such as "Digital Phase Modulation" by Anderson, Aulin and Sundberg and "Digital Communications" by John G. Proakis.

In digital communications systems, for example, cellular and PCS (personal communications systems), computer communications systems, and SATCOM (satellite communications) systems, digital data is modulated by the modem onto a signal to be transmitted over a communications channel. Data is typically encoded before transmission to a receiver or to a storage device, to protect the data from errors, which may result from a noisy communications channel or a defect in the storage medium. An encoder manipulates data symbols in accordance with an error correction code and produces error correction symbols or a structured redundancy output sequence. When the code word is later received or retrieved it is decoded to reproduce the data symbols, and errors in the data symbols are corrected, if possible, using the error correction symbols or the structured redundancy of code.

For the following discussion, a convolutional codeword is defined as the n output bits that are generated based on an input of k input bits (i.e., rate k/n code). One method of decoding code words encoded using a convolutional code is maximum likelihood decoding. One kind of maximum likelihood decoder is commonly referred to as a Viterbi decoder. Conceptually, a Viterbi decoder uses a decoding trellis, which has a branch for each possible code word and connected paths of branches for each possible stream, or sequence, of code words. The decoder essentially finds a path through the trellis, which is "closest" to, or most like, the received stream of code words. It then treats the code words on this "most likely" trellis path as the received code words and assigns data values to them, to produce a best estimate of the transmitted data.

To determine the most likely path, the decoder calculates, for each received code word, a set of branch metrics as numerical representation of the likelihood that the transmitted code word, which may contain errors on reception, is actually the code word which corresponds to a particular branch. In one such decoder the branch metrics are the Hamming distances between the received code word and the code words associated with the various branches.

Each branch in the decoding trellis leads from an initial state, which represents the state that the registers are in prior to the formulation of the code word associated with the branch, and leads to an end state, which represents the state that the registers are in after the formulation of the code word. For a binary code there are $2^{K-1}$ possible states associated with each decoding level, where K is the constraint length of the code. For example, the code may have a constraint length of 3, i.e., there are 2 registers, and there are thus 4 possible register states, namely, 00, 01, 10, 11, in each decoding level. Since the code is a rate 1/n code, i.e. binary code so k=1, there are two possible branches leading from each initial state, namely a branch associated with a zero data bit and a branch associated with a one data bit. Each of these branches necessarily leads to a different end state. Thus, for each of the $2^{K-1}$ states in a given decoding stage, there are two branches leading to each of these states, and each branch may represent the transmitted code word. Accordingly, to decode the code word the decoder must determine two branch metrics for each of the $2^{K-1}$ possible end states, or a total of $2(2^{K-1})$ branch metrics. For convolutional codes, there are only $2^n$ unique branch metric values.

Once the decoder calculates these branch metrics, it next determines the metrics of the various paths leading to the end states. Accordingly, the decoder adds to the branch metrics the appropriate path metrics, which are the sums of the branches leading to the current starting states. The decoder then selects a most likely path leading to each of the end states and stores for later use the path metrics and information, which identifies these most likely paths. These most likely paths, which are also referred to as the "surviving paths." The decoder does not retain information relating to the less likely, or non-surviving, paths. In this way, the decoder "prunes" these paths from the trellis, and thereby eliminates for a next level of decoding a portion of the path metric calculations.

When a sufficient number of code words have been included in the trellis paths, the most likely code word path is chosen from the surviving paths associated with the end states. The decoder selects as the most likely path the code word path which is "closest" to the received data, i.e., the path with the smallest Hamming distance metric. The decoder then decodes the code words on the most likely path, or "traces back" along the path, to determine the associated data bits.

The Viterbi algorithm is used not only to decode convolutional codes but also to produce the maximum-likelihood estimate of the transmitted sequence through a channel with intersymbol interference (ISI), and to decode trellis-coded modulation (TCM) and other modulations with memory. The Viterbi decoder is typically divided into three functional parts. The first part is an add-compare-select (ACS) unit that is used to calculate the path metrics. The second part is the survivor memory control unit for survivor memory management, which may store the survivor sequences as last part of the Viterbi decoder.

Continuous phase modulation (CPM) is being applied in communications due to its bandwidth efficiency and constant envelope characteristics. With CPM, the modulated signal phase transitions are smoothed. For example, with Binary Phase-Shift Keying (BPSK), a logic one is transmitted as one phase of a modulated signal, and a logic zero is transmitted as 180-degree phase-shifted with a sharp transition (i.e., instantaneous) in phase. This sharp phase transition results in broadening of the transmitted spectrum. With CPM the phase of the transmitted signal makes smooth phase changes over the bits of the modulating digital signal. An example of CPM is Minimum Shift Keying (MSK) modulation.

Multi-h continuous phase modulation (multi-h CPM) is itself a broad class of modulated waveforms. The class includes signals with constant amplitude but varying phase. Multi-h CPM differs from the single-h format by using a set of H modulation indices in a cyclic manner. This results in the delayed merging of neighboring phase trellis paths and ultimately, in improved error performance. A detailed description of multi-h CPM waveforms is included in the book "Digital Phase Modulation" by Anderson, Aulin, and Sundberg, Plenum Press, New York, 1986.

As described by articles in Svensson, "Reduced State Sequence Detection of Full Response Continuous Phase Modulation," Electronics Letter, May 10, 1990, Vol. 26, No. 10; and Eyuboglu et al., "Reduced State Sequence Estimation With Set Partitioning and Decision Feedback," IEEE Transactions on Communications, January 1988, Vol. 36, No. 1, (and others), some techniques reduce the complexity of the standard MLSE (Maximum Likelihood Sequence Estimator) decoders. For example, in Eyuboglu, a reduced-state sequence estimator for linear intersymbol interference (ISI) channels uses a conventional Viterbi algorithm (VI) with decision feedback to search in a reduced-state "subset trellis" which is constructed using set partitioning principles. The complexity of maximum likelihood sequence estimation (MLSE) due to the length of the channel memory and the size of the signal set is systematically reduced. An error probability analysis shows that a good performance/complexity tradeoff can be obtained. In Svensson, a reduced state sequence detector (RSSD) combines decision feedback with Viterbi decoding for M-ary full response continuous phase modulation. The detector is analyzed with minimum Euclidean distances and by simulations of the symbol error probability. The M-ary full response CPM schemes can be decoded by a decoder with only two states, when the modulation index is relatively small (<1/M) and for larger modulation indexes less than one with M states. There are several variants of the reduced state MLSE decoders, which do not provide the same (reduced) complexity or modem bit error rate performance.

The use of Forward Error Correction (FEC) and the maximum likelihood decoder (Viterbi algorithm) is described in most standard communications texts. Reduced state sequence estimation (RSSE) was an important development in MLSE decoder design in the 1980's. The developers and manufacturers XILINX and Altera produce FPGA and VHSIC Hardware Description Language (VHDL) tools that allow users a few programmable Viterbi (NLSE) options. These are usually formed as convolutional codes with the ability to provide soft decision metrics. None of the current tools provide for a desired decision feedback or trellis structure manipulation required for reduced-state sequence estimation. They also are not programmable for use with CPM signals and signals with memory. Also, there exists a need in the industry for a reduced state, generic, programmable maximum likelihood decoder.

SUMMARY OF THE INVENTION

A decoder includes at least one programming input for a plurality of programmable reduced-state trellis parameters. A programmable device is connected to the at least one programming input and implements a reduced-state maximum likelihood decoder that is operable for processing a continuous phase modulated (CPM) signal and returning up to N bits that were transmitted based on a maximum likelihood and current winning super-state and corresponding survivor full-state. The programmable device calculates the path metrics for every super-state and determines a best path based on the reduced-state trellis parameters.

The programmable reduced-state trellis parameters are formed from one of at least a number of super-states, the number of full-states, the number of branches per super-state, a reverse super-state trellis table, a decoder super-state survivor as a full-state, a forward full-state table, a full-state to super-state mapping table, decoder super-state path metric and decoder super-state traceback array. All programmable parameters are integers. The decoder state structure can be formed of a path metric per super-state, a traceback array per super-state, and a survivor full-state per super-state. The reduced-state trellis structure can be formed from an Ungerboeck-style set-partitioning algorithm. A reduced-state trellis structure can be formed from a two-state Svensson-style structure or an M-state Svensson-style structure.

The decoder state structure could contain path metrics and a full decoder state used for decision feedback. The reduced-state maximum likelihood decoder could be formed as a forward trellis structure operative for indicating which full decoder state from a decision feedback is connected to a full decoder state for any given symbol. At least one output can be connected to the programmable device for outputting decoded bits with multiple bits per output. An output can be operative for outputting a full traceback of decoded bits for a best path.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
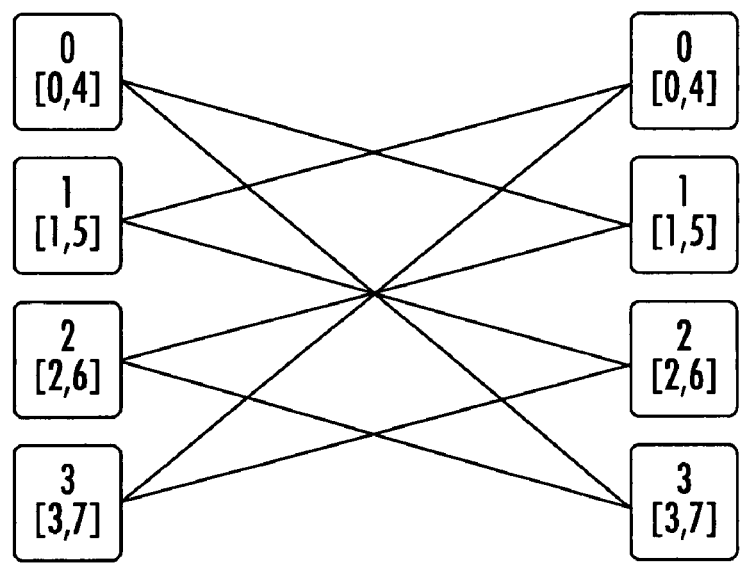
FIG. 1 is a high-level diagram of a reduced state trellis structure, in accordance with one non-limiting example of the present invention.

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art. Like numbers refer to like elements throughout.

The system and method, in accordance with a non-limiting example of the present invention, provides a reduced-state sequence estimation (RSSE) generic and programmable decoder that has input programmability for the number of super states in each trellis. Full states can be combined to form super states. There are a number of branches per super state and a number of trellis structures. The plurality of programmable super state trellis parameters preferably includes trellis connectivity information for trellis stages, active and inactive super state for each trellis stage, a trellis branch transition data value and a metric index for trellis branch transition, and may include a number of trellis structures, a number of trellis super states for each trellis structure, and a number of branches for each trellis super state. The reverse state trellis structure connects each super state with a list of previous super states. The decoder super state structure contains path metrics and a "winning" full state used for decision feedback. A forward state trellis can define which full state from the decision feedback is connected to the next full state for any given bit. The output of the decoder includes decoded bits with multiple bits per output and a full traceback of all decoded bits for that path. The difference between the best and worst path metrics can be provided and the "winning" state for the current best path chosen. Also, the trellis structure may include a reverse-state trellis structure and/or a forward-state trellis structure.

Some existing communications devices have limited program space, CPU computation speed and battery power. To meet these requirements, a software-based or FPGA-based reduced state maximum likelihood decoder in accordance with non-limiting examples of the present invention supports demodulation of waveforms with memory. It is also programmable and supports demodulation of Continuous Phase Modulation (CPM) and decoding of most FEC trellis codes. The reduced state decoder in accordance with non-limiting examples of the present invention varies from most standard trellis decoders because of non-limiting features that include:

1) The decoder state table has a "winning full states memory, in addition to maintaining the winning" path metric; and 2) The decoder has a forward trellis structure (linked list) that indicates how each full state in the decoder is connected to the next full state.

Although reduced state decoders are described in many publications, the decoder in accordance with a non-limiting example includes a "one-size-fits-all" approach for the design of the decoder state table and the trellis structure. A single implemented FPGA/DSP (digital signal processor) architecture can decode most trellis codes or memory based (i.e., CPM) modulation schemes.

The reduced-state Viterbi detector has a reduced complexity of hardware and uses a reduced-state trellis. The detector could consider a shortened impulse response and cancel intersymbol interference due to the tail of the impulse response for each state by using past survivor symbols, in some non-limiting examples. In an RSSE algorithm, the number of states could be reduced by partitioning each element in a state vector into a given number of subsets and representing the subset vector as a reduced state trellis. The reduced state could be done on the basis of Ungerboeck's set partitioning principles such that the impulse response data are estimated according to the maximum likelihood sequence estimation (MLSE) method via the Viterbi algorithm. A transmit sequence can be estimated from possible data sequences taking into account the received sequence and estimated impulse response of a transmission system. RSSE can reduce the complexity of the MLSE by truncating channel memory or applying set partitioning to the signal alphabet. RSSE algorithms can search for the most likely data sequence in the reduced trellis by keeping only the best survivor or winning paths for each reduced state. Several states can be merged, and thus, reduce the complexity of the MLSE. Each super state in a reduced-state trellis can be formed by combining states of the original maximum likelihood trellis using the Ungerboeck-like set partitioning principles. When a binary transmission is used, the RSSE algorithm could become a state-truncation technique, where each super state in the reduced-state trellis is formed by truncating the maximum likelihood state vector to a suitable length.

As noted above, an Ungerboeck style (set partitioning) reduced state trellis structure for a h=¼ (8 states) Continuous Phase Frequency Shift Keying (CPPSK) modulation is shown in FIG. 1. The full state labels are marked in brackets and new super state labels listed above each bracketed pair. This reduced state trellis structure is one-half as complex as the original trellis structure without any reduction in Bit Error Rate (BER) performance.

Figure 2:
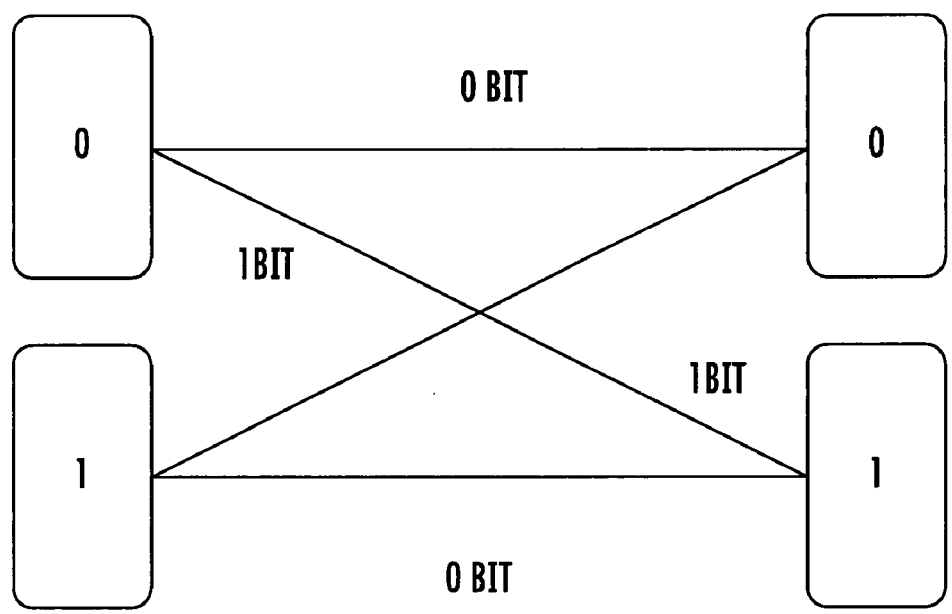
FIG. 2 is a high-level diagram of a two-state, reduced-state trellis structure, in accordance with one non-limiting example of the present invention.

A Svensson style (2 state) approach for binary h=¼ CPFSK modulation is shown in FIG. 2. It has a similar trellis structure used for any (h-value) CPFSK modulation and reduces the trellis complexity by a factor of four (for h=¼).

The maximum-likelihood sequence estimator as defined in the incorporated by reference Svensson reference has only two states (for binary full response CPM) and its trellis structure is shown in FIG. 2.

As illustrated, a one-valued bit causes a state transition and a zero-valued bit does not. This can be implemented with little difficulty and can be adapted to any single-h binary CPFSK modulation. As with the set-partitioning approach, decision feedback is used to maintain the winning phase state of each of the two super states. The decoder calculates the path metrics for the two valid paths from the chosen, winning phase and picks a new winning path metric, which is then saved in the super state based on the branch taken during the symbol. If the branch corresponds to a 0-valued bit, then the new super state is the same as the old super state. If, however, the transition corresponds to a one-valued bit, then the path metric transitions to the other super state.

Figure 3:
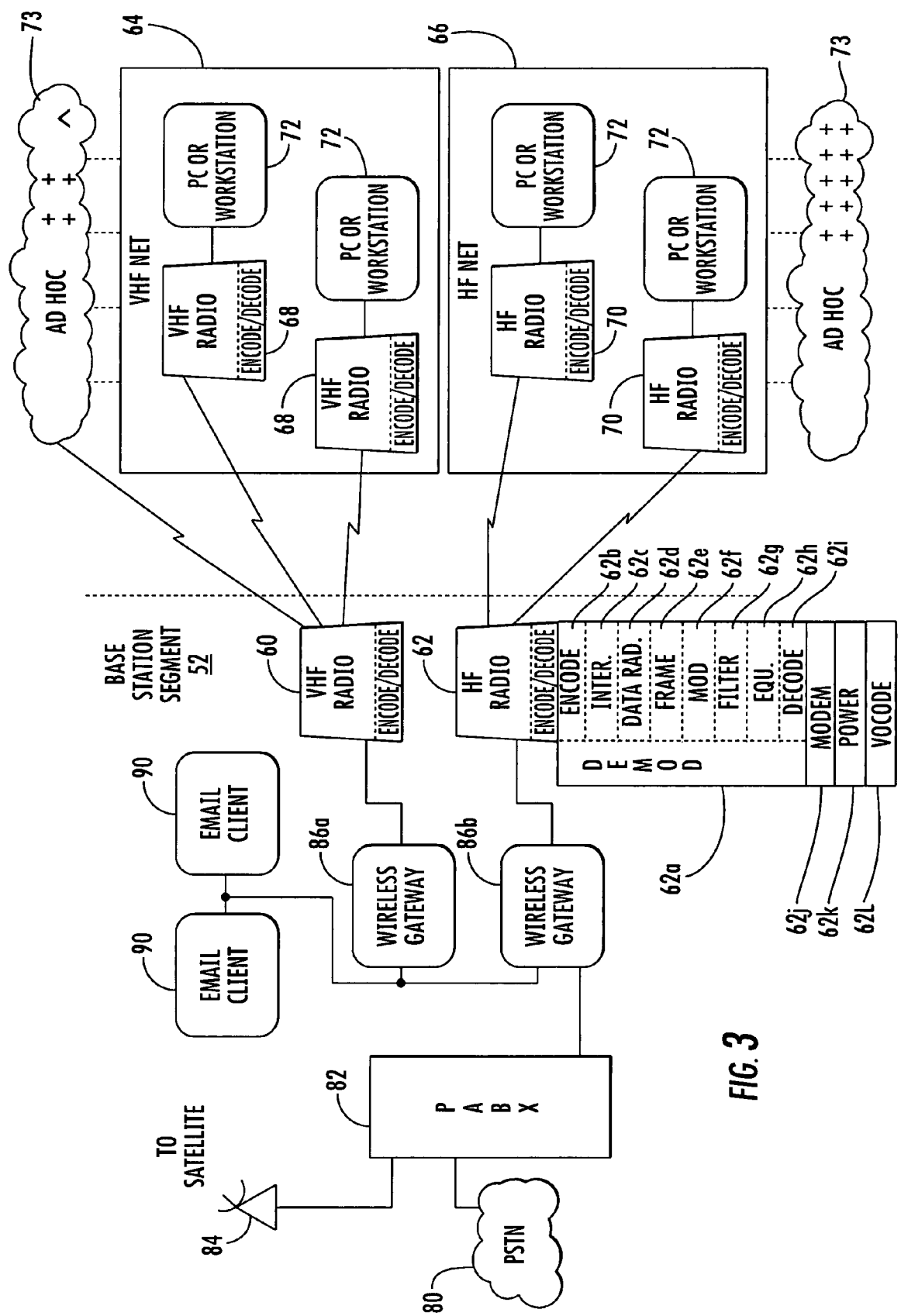
FIG. 3 is a block diagram of an example of a communications system that includes various radios, which could include decoders in accordance with the present invention.

Referring now to FIGS. 3-6, an example of a communications system that can include various radios having the decoder used with the present invention is now set forth with respect to FIG. 3, followed by a high-level description of a reduced-state, generic and programmable trellis decoder (FIGS. 4 and 5) and flowchart (FIG. 6) explaining the decoder.

An example of a radio that could be used with such system and method in accordance with non-limiting examples of the present invention is a Falcon™ III radio manufactured and sold by Harris Corporation of Melbourne, Fla. It should be understood that different radios can be used, including software defined radios that can be typically implemented with relatively standard processor and hardware components and mesh network radios. One particular class of software radio is the Joint Tactical Radio (JTR), which includes relatively standard radio and processing hardware along with any appropriate waveform software modules to implement the communication waveforms a radio will use. JTR radios also use operating system software that conforms with the software communications architecture (SCA) specification (see www.jtrs.saalt.mil), which is hereby incorporated by reference in its entirety. The SCA is an open architecture framework that specifies how hardware and software components are to interoperate so that different manufacturers and developers can readily integrate the respective components into a single device.

The Joint Tactical Radio System (JTRS) Software Component Architecture (SCA) defines a set of interfaces and protocols, often based on the Common Object Request Broker Architecture (CORBA), for implementing a Software Defined Radio (SDR). In part, JTRS and its SCA are used with a family of software re-programmable radios. As such, the SCA is a specific set of rules, methods, and design criteria for implementing software re-programmable digital radios.

The JTRS SCA specification is published by the JTRS Joint Program Office (JPO). The JTRS SCA has been structured to provide for portability of applications software between different JTRS SCA implementations, leverage commercial standards to reduce development cost, reduce development time of new waveforms through the ability to reuse design modules, and build on evolving commercial frameworks and architectures.

The JTRS SCA is not a system specification, as it is intended to be implementation independent, but a set of rules that constrain the design of systems to achieve desired JTRS objectives. The software framework of the JTRS SCA defines the Operating Environment (OE) and specifies the services and interfaces that applications use from that environment. The SCA OE comprises a Core Framework (CF), a CORBA middleware, and an Operating System (OS) based on the Portable Operating System Interface (POSIX) with associated board support packages. The JTRS SCA also provides a building block structure (defined in the API Supplement) for defining application programming interfaces (APIs) between application software components.

The JTRS SCA Core Framework (CF) is an architectural concept defining the essential, "core" set of open software Interfaces and Profiles that provide for the deployment, management, interconnection, and intercommunication of software application components in embedded distributed-computing communication systems. Interfaces may be defined in the JTRS SCA Specification. However, developers may implement some of them, some may be implemented by non-core applications (i.e., waveforms, etc.), and some may be implemented by hardware device providers.

For purposes of description only, a brief description of an example of a communications system that would benefit from the present invention is described relative to a non-limiting example shown in FIG. 3. This high-level block diagram of a communications system 50 includes a base station segment 52 and wireless message terminals that could be modified for use with the present invention. The base station segment 52 includes a VHF radio 60 and HF radio 62 that communicate and transmit voice or data over a wireless link to a VHF net 64 or HF net 66, each which include a number of respective VHF radios 68 and HF radios 70, and personal computer workstations 72 connected to the radios 68,70. Ad-hoc communication networks 73 are interoperative with the various components as illustrated. Thus, it should be understood that the HF or VHF networks include HF and VHF net segments that are infrastructure-less and operative as the ad-hoc communications network. Although UHF radios and net segments are not illustrated, these could be included.

The HF radio can include a demodulator circuit 62a and appropriate convolutional encoder circuit 62b, block interleaver 62c, data randomizer circuit 62d, data and framing circuit 62e, modulation circuit 62f, matched filter circuit 62g, block or symbol equalizer circuit 62h with an appropriate clamping device, deinterleaver and decoder circuit 62i modem 62j, and power adaptation circuit 62k as non-limiting examples. A vocoder circuit 62l can incorporate the decode and encode functions and a conversion unit which could be a combination of the various circuits as described or a separate circuit. These and other circuits operate to perform any functions necessary for the present invention, as well as other functions suggested by those skilled in the art. Other illustrated radios, including all VHF mobile radios and transmitting and receiving stations can have similar functional circuits.

The base station segment 52 includes a landline connection to a public switched telephone network (PSTN) 80, which connects to a PABX 82. A satellite interface 84, such as a satellite ground station, connects to the PABX 82, which connects to processors forming wireless gateways 86a, 86b. These interconnect to the VHF radio 60 or HF radio 62, respectively. The processors are connected through a local area network to the PABX 82 and e-mail clients 90. The radios include appropriate signal generators and modulators.

An Ethernet/TCP-IP local area network could operate as a "radio" mail server. E-mail messages could be sent over radio links and local air networks using STANAG-5066 as second-generation protocols/waveforms, the disclosure which is hereby incorporated by reference in its entirety and, of course, preferably with the third-generation interoperability standard: STANAG-4538, the disclosure which is hereby incorporated by reference in its entirety. An interoperability standard FED-STD-1052, the disclosure which is hereby incorporated by reference in its entirety, could be used with legacy wireless devices. Examples of equipment that can be used in the present invention include different wireless gateway and radios manufactured by Harris Corporation of Melbourne, Fla. This equipment could include RFS800, 5022, 7210, 5710, 5285 and PRC 117 and 138 series equipment and devices as non-limiting examples.

These systems can be operable with RF-5710A high-frequency (HF) modems and with the NATO standard known as STANAG 4539, the disclosure which is hereby incorporated by reference in its entirety, which provides for transmission of long distance HF radio circuits at rates up to 9,600 bps. In addition to modem technology, those systems can use wireless email products that use a suite of data-link protocols designed and perfected for stressed tactical channels, such as the STANAG 4538 or STANAG 5066, the disclosures which are hereby incorporated by reference in their entirety. It is also possible to use a fixed, non-adaptive data rate as high as 19,200 bps with a radio set to ISB mode and an HF modem set to a fixed data rate. It is possible to use code combining techniques and Automatic Repeat Request (ARQ).

Figure 4:
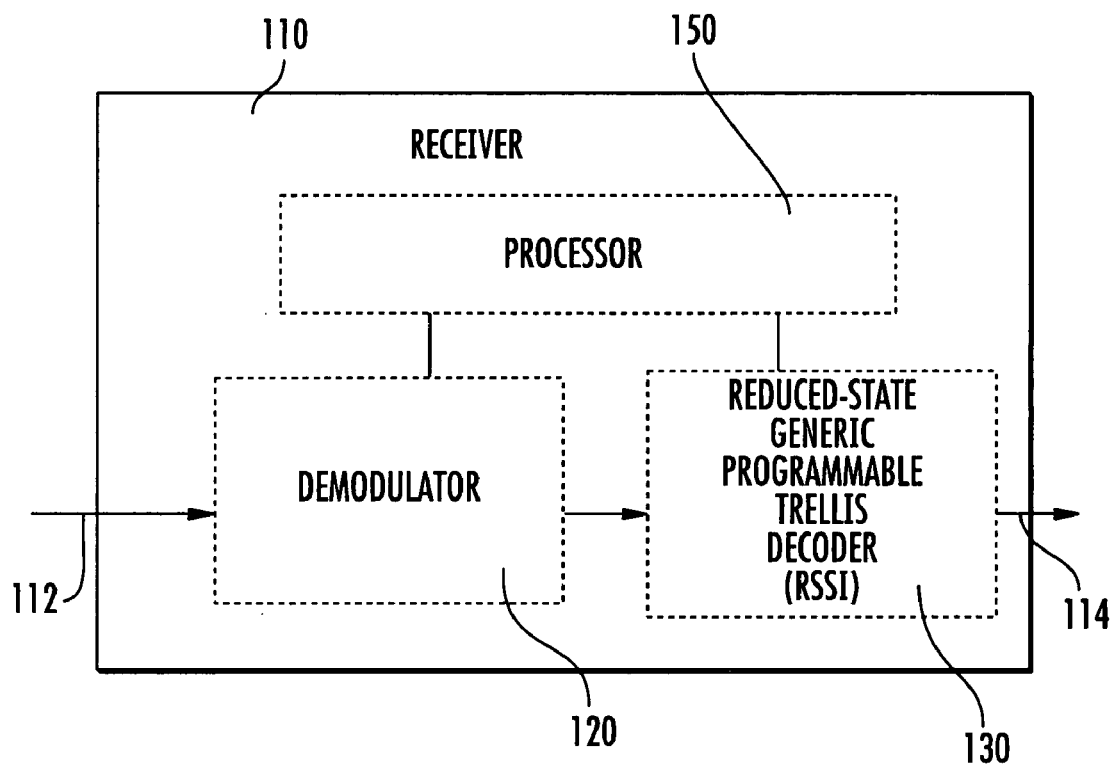
FIG. 4 is a block diagram of a receiver that includes a programmable trellis decoder that can be modified for use in accordance with the present invention as a reduced-state, generic and programmable maximum likelihood decoder as a trellis decoder.
Figure 5:
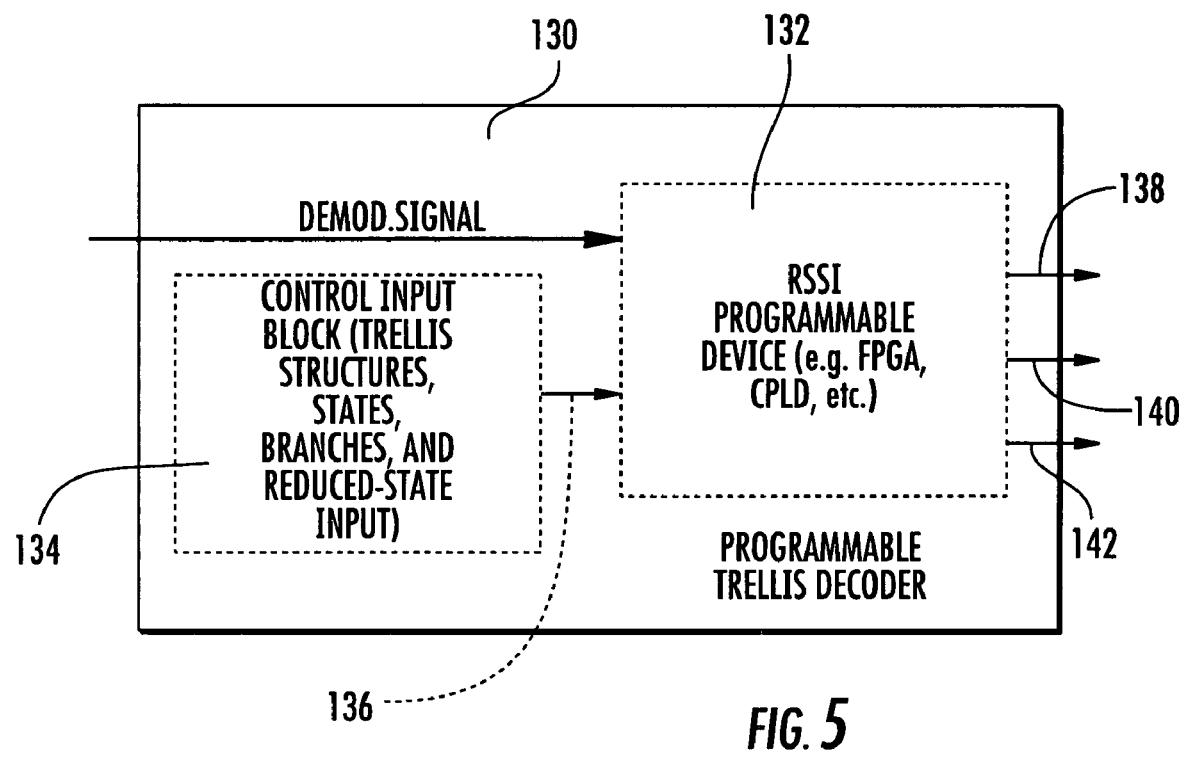
FIG. 5 is a more detailed block diagram of the reduced-state, generic and programmable trellis decoder shown if FIG. 4.

There now follows a description of an example of a reduced-state, generic and programmable trellis decoder in accordance with non-limiting examples of the present invention. Referring initially to FIGS. 4 and 5, an embodiment of a data communications receiver 110, such as a UHF satellite communications receiver, including a reduced-state, generic programmable trellis decoder 130 will be described. Encoded and modulated signals sent over a communications channel 112 are received by the receiver 110. These modulated signals could be any signals with memory such as CPM, ISI channels or trellis coded modulation (TCM). A demodulator 120 processes the incoming signal, then sends the baseband demodulated signal to the programmable trellis decoder 130. The programmable trellis decoder 130 processes the signal and then sends the decoded data and other related information to a destination over the channel 114. The components of the receiver, e.g. the demodulator 120 and the programmable trellis decoder 130, are controlled by a processor 150.

The reduced-state, generic programmable trellis decoder 130 uses the RSSE algorithm and methodology explained above, and includes at least one programming input 134, 136 for a plurality of programmable trellis parameters. It should be understood that the reduced-state decoder, in accordance with a non-limiting example of the present invention, varies from a standard trellis decoder because the decoder state table has a "winning full state" memory in addition to maintaining the "winning" path metric. The decoder has a Forward Trellis structure as a linked list that indicates how each full state in the decoder is connected to the next full state. Thus, a single implemented field programmable gate array and digital signal processing architecture can decode any trellis code, ISI channel or memory-based modulation, i.e., CPM.

The reduced-state sequence estimation programmable decoder can have an input programmability that includes the number of super states in each trellis stage, number of trellis stages and which full states are combined to form the super states. It can also include input programmability for the number of branches per super state, the number of trellis structures, a reverse-state trellis structure that connects each super state with a list of previous super states, active and inactive states for each trellis stage, a trellis branch transition data value and a metric index for trellis branch transition. The decoder super state structure can contain path metrics and a "winning" full state that is used for decision feedback. A forward-state trellis can define which full state from the decision feedback (i.e., survivor path) is connected to the next full state for any given bit.

The output of the decoder could include decoded bits with multiple bits per output. The full trace back of all decoded bits for that path can be included. The output can include the difference between the best and worst path metrics and the "winning" state for the current best path.

The decoder could include an add-compare-select (ACS) unit to receive a sequence of trellis coded bits and calculate path metrics and output sequences based upon branch metrics associated with each branch of a trellis-state diagram, a survivor memory for storing the output sequences, and a survivor memory control unit to control the survivor memory and output decoded bits of the stored output sequences, as would be appreciated by those skilled in the art.

A programmable device 132 is connected to the programming input and implements a programmable trellis decoder (e.g., a continuous phase modulation (CPM) decoder) having at least one trellis structure defined based upon the plurality of programmable trellis parameters. The programmable device 132 may comprise a field programmable gate array (FPGA), for example.

An FPGA is a semiconductor device containing programmable logic components and programmable interconnects. The programmable logic components can be programmed to duplicate the functionality of basic logic gates (such as AND, OR, XOR, NOT) or more complex combinatorial functions such as decoders or simple math functions. In most FPGA's, these programmable logic components (or logic blocks) also include memory elements, which may be simple flip-flops or more complex blocks of memories.

A hierarchy of programmable interconnects allows the logic blocks of an FPGA to be interconnected as needed by the system designer, somewhat like a one-chip programmable breadboard. These logic blocks and interconnects can be programmed after the manufacturing process by the customer/designer (i.e., "field-programmable") so that the FPGA can perform whatever logical function is needed.

FPGA's are generally slower than their application-specific integrated circuit (ASIC) counterparts, cannot handle as complex a design, and draw more power. However, they have several advantages such as a shorter time to market, ability to reprogram in the field to fix bugs, and lower non-recurring engineering costs. Another alternative is complex programmable logic devices (CPLD's).

To define the behavior of the FPGA the user may provide a hardware description language (HDL) or a schematic design in some non-limiting examples. Common HDL's are VHDL and Verilog. Then, using an electronic design automation tool, a technology-mapped netlist is generated. The netlist can then be fitted to the actual FPGA architecture using a process called place-and-route, usually performed by place-and-route software. The user can validate the map, place and route results via timing analysis, simulation, and other verification methodologies. Once the design and validation process is complete, the binary file generated can be used to reconfigure the FPGA device. Such a binary file may be stored and/or input to the programmable device 132 via the control input block 134.

As a non-limiting example, the programmable trellis decoder 130 may implement CPM and preferably multi-h CPM. With CPM the phase of the transmitted signal makes smooth phase changes over the bits of the modulating digital signal. An example of CPM is minimum shift keying (MSK) modulation. Multi-h continuous phase modulation (multi-h CPM) is itself a broad class of modulated waveforms. The class includes signals with constant amplitude but varying phase. Multi-h CPM differs from the single-h format by using a set of H modulation indices in a cyclic manner. This results in delayed merging of neighboring phase trellis paths and ultimately, in improved error performance.

One or more outputs 138, 140, 142 of the programmable device 132 are provided for outputting decoded bits with multiple bits per output and the full traceback of all decoded bits for a best path, for outputting a difference between a best and worst path metric, and/or for outputting a winning state for a current best path.

The reduced-state generic programmable trellis decoder 130 provides the appropriate structure and flexibility in the decoder to handle all the above-mentioned trellis schemes. The active and inactive states per trellis stage can be done by having a delta increment between states or an active/inactive flag. Active/inactive provides flexibility as there may be cases where there are no good delta increments between current and next active state. A different starting state for each trellis stage may be provided to avoid extra computations but active/inactive state works here too. Metrics to be used as branch metrics are provided by user based on required trellis stage, node identification and branch connection. Only metrics for active super states need to be computed. A different set of branch connections are included for each trellis stage via a reverse lookup table at the add/compare/select point.

An example for Node 0 (if trellis has 16 states there would be 16 states for each trellis stage). The repeat structure may be 4 trellis stages long and for each stage there would be active and inactive stages and reverse lookup tables. This type of structure would be required for a multi-h CPM, but this same structure could be used for less complicated trellis schemes by simply changing the connectivity of the trellis reverse look-up table and the choice of active/inactive states. Thus, the approach leads to a generic trellis decoder, which can handle many more trellis schemes than simple convolutional/TCM decoders available currently.

As an example, a multi-h CPM waveform may be demodulated with the generic programmable trellis decoder 130. Multi-h implies a different modulation index h for each CPM symbol. For the case of 2h, there are two different values of h that change every other symbol. For example, binary CPM with h0=4/16, h1=5/16. Even number symbols use modulation index h0, and odd number symbols use modulation index h1. For h0=4/16, the trellis backward connectivity is as follows (data 0 negative frequency (i.e., data=−1); data 1=positive frequency):

| Format: State number: previous data = 0 | | previous data = 1 |
|---|---|---|
| State 0: | 4 | 28 |
| State 1: | 5 | 29 |
| State 2: | 6 | 30 |
| State 3: | 7 | 31 |
| State 4: | 8 | 0 |
| State 5: | 9 | 1 |
| State 6: | 10 | 2 |
| State 7: | 11 | 3 |
| State 8: | 12 | 4 |
| State 9: | 13 | 5 |
| State 10: | 14 | 6 |
| State 11: | 15 | 7 |
| State 12: | 16 | 8 |
| State 13: | 17 | 9 |
| State 14: | 18 | 10 |
| State 15: | 19 | 11 |
| State 16: | 20 | 12 |
| State 17: | 21 | 13 |
| State 18: | 22 | 14 |
| State 19: | 23 | 15 |
| State 20: | 24 | 16 |
| State 21: | 25 | 17 |
| State 22: | 26 | 18 |
| State 23: | 27 | 19 |
| State 24: | 28 | 20 |
| State 25: | 29 | 21 |
| State 26: | 30 | 22 |
| State 27: | 31 | 23 |
| State 28: | 0 | 24 |
| State 29: | 1 | 25 |
| State 30: | 2 | 26 |
| State 31: | 3 | 27 |

For h1 = 5/16, the trellis backward connectivity is as follows:

| State | prev data = 0 | prev data = 1 |
|---|---|---|
| State 0: | 5 | 27 |
| State 1: | 6 | 28 |
| State 2: | 7 | 29 |
| State 3: | 8 | 30 |
| State 4: | 9 | 31 |
| State 5: | 10 | 0 |
| State 6: | 11 | 1 |
| State 7: | 12 | 2 |
| State 8: | 13 | 3 |
| State 9: | 14 | 4 |
| State 10: | 15 | 5 |
| State 11: | 16 | 6 |
| State 12: | 17 | 7 |
| State 13: | 18 | 8 |
| State 14: | 19 | 9 |
| State 15: | 20 | 10 |
| State 16: | 21 | 11 |
| State 17: | 22 | 12 |
| State 18: | 23 | 13 |
| State 19: | 24 | 14 |
| State 20: | 25 | 15 |
| State 21: | 26 | 16 |
| State 22: | 27 | 17 |
| State 23: | 28 | 18 |
| State 24: | 29 | 19 |
| State 25: | 30 | 20 |
| State 26: | 31 | 21 |
| State 27: | 0 | 22 |
| State 28: | 1 | 23 |
| State 29: | 2 | 24 |
| State 30: | 3 | 25 |
| State 31: | 4 | 26 |

Analyzing the trellis structure for symbols (stages) 1, 2, . . . , 8:

| Format: H# | Start_State | Delta_State |
|---|---|---|
| Stage 1 | H0 | 0 | 2 |
| Stage 2 | H1 | 1 | 2 |
| Stage 3 | H0 | 1 | 2 |
| Stage 4 | H1 | 0 | 2 |
| Stage 5 | H0 | 0 | 2 |
| Stage 6 | H1 | 1 | 2 |
| Stage 7 | H0 | 1 | 2 |
| Stage 8 | H1 | 0 | 2 |

To decode Stage 1, start at state 0 and increment states by two for next state (i.e. only even states are active). For Stage 2, only decode odd states. For Stage 3, decode only odd states and for Stage 4 decode only even states and then pattern repeats.

This is why the generic programmable trellis decoder 130 provides the ability to have active states and inactive states (for most general case) or start state and delta state (as a alternative embodiment). Also, the backward trellis structure is needed to decode CPM properly.

So, the initialization process of the generic programmable trellis decoder 130 prior to use in demodulating waveform will now be summarized. The trellis structure includes: Stage N; Trellis Connectivity; Active/Inactive States; Data Value causing Transition (i.e., branch transition data value); and Metric index for given trellis branch transition.

First, the trellis structure (e.g., for CPM or other) is analyzed to determine active/inactive states and connectivity. The connectivity information is written to decoder for as many trellis stages as is necessary before pattern repeats (typically just one stage for convolutional codes, two for 1 h CPM and four for 2h CPM example above). Active/inactive states (or start state and delta state) are written for each trellis stage of trellis decoder (before pattern repeats). The data value that causes trellis branch transition is written to the trellis decoder structure. The metric index used for trellis branch transition is written to trellis decoder.

Example

Trellis Branch Structure Stage 0. The backward trellis structure includes: State 0 from State 4 via a 0 bit using branch metric index 0; State 0 from State 12 via a 1 bit using branch metric index 1; State 1 from State 5 via a 0 bit using branch metric index 2; State 1 from State 13 via a 1 bit using branch metric index 3, etc.

To begin demodulating data: the branch metric array is written to trellis decoder (this will be used by decoder using the metric index; add/compare/select function is executed for each active state; traceback function is executed to extract decoded information; and output data is provided to user.

Figure 6:
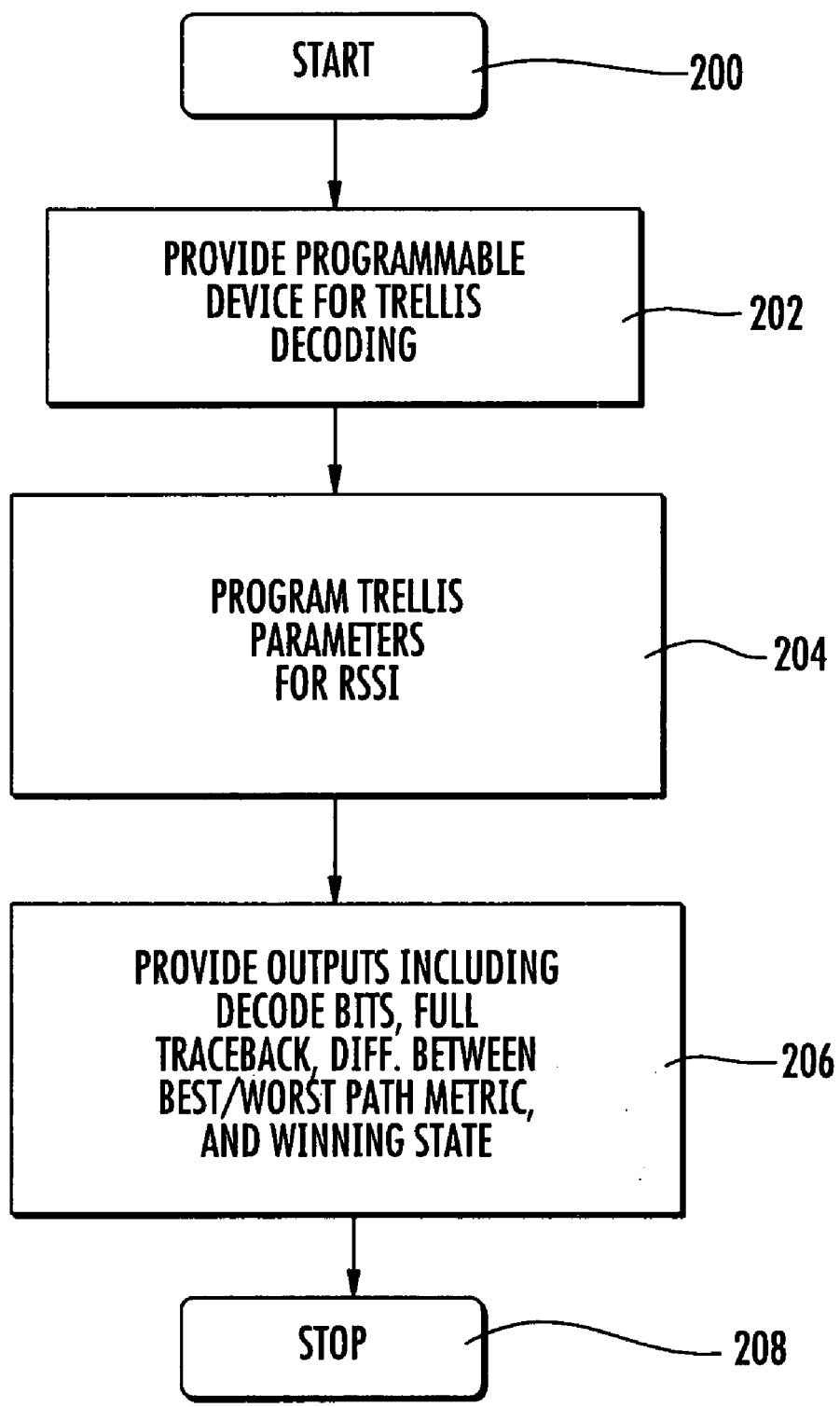
FIG. 6 is a flow chart illustrating steps in a method of implementing a reduced-state, generic and programmable trellis decoder, in accordance with a non-limiting example of the present invention.

A method aspect of the invention is directed to a method of implementing a reduced-state generic programmable trellis decoder 130 (such as a continuous phase modulation (CPM) decoder) and will be discussed with reference to the flowchart of FIG. 6. The method begins at block 200 and includes, at block 202, providing a programmable device 132 (such as an FPGA) to implement the programmable trellis decoder 130 and includes at least one trellis structure defined based upon a plurality of programmable trellis parameters. The method further includes programming the plurality of programmable trellis parameters via at least one programming input (block 204).

As discussed above, programming the plurality of programmable trellis parameters may include programming a number of trellis structures, programming a number of trellis states for each trellis structure, and programming a number of branches for each trellis state. The method may include, at block 206, providing at least one output connected to the programmable device 132 for outputting decoded bits with multiple bits per output and the full traceback of all decoded bits for a best path, a difference between a best and worst path metric, and/or a winning state for a current best path.

To meet various requirements, an FPGA-based maximum likelihood decoder has been designed which is reduced-state and programmable and will support demodulation of CPM, TCM and any FEC trellis code. It has been designed to support binary-h, 4-ary, CPM.

There follows now a description of reduced state decoder and theory of operation.

The Continuous Phase Modulation (CPM) waveform defined in the MIL-STD-188-181C Satellite Communications standard has a thirty-two state trellis structure. The complexity of the maximum-likelihood sequence estimator used to demodulate this signal is further increased because the CPM signal has two modulation indices (h-values) that require that the decoder store two sets of path metrics, one for each of the h-values. Approaches are taken to reduce the complexity of the trellis structure of the CPM signal without significantly reducing the demodulation performance for the range of signal to noise ratio values required by the UHF Satellite Communications standard. As noted before, the first state reduction method uses Ungerboeck-style set partitioning. Another approach utilizes a completely different 4-state trellis structure with branch transitions defined that take advantage of the differential properties of the CPM modulation.

Continuous Phase Modulation is a constant envelope modulation with time domain representation:

$$s(t) = \sqrt{2E/T} \cos\left(2\pi f t + 2\pi \sum_{i=0}^{n} \alpha_i h_i q(t - iT)\right)$$

where T is the symbol period, E is the energy per symbol, f is the carrier frequency, α is the data symbol, h is the modulation index, and q is the phase pulse shape.

The UHF SATCOM standard provides for (up to) twelve different variations of full-response, quaternary, multi-h CPM modulation schemes with different symbol rates and modulation indices (h-values) to control the receive complexity and transmit frequency spectra. All of the variants result in 32 phase states where only ½ of the states are active at any given symbol period. In all cases, there are two h-values defined as the ratio p/q where q is always 16 and p alternates between even and odd integer values.

There are two documented methods for reducing the number of states and the corresponding receiver complexity. The first method, described by Eyuboglu, combine states using the Euclidean distance as a metric (set-partitioning). The second method, described by Svensson, uses a tilted-phase approach to CPM demodulation, which automatically eliminates the inactive states in the trellis. Svensson further reduces states based on differential phase of each branch in the trellis.

Figure 8:
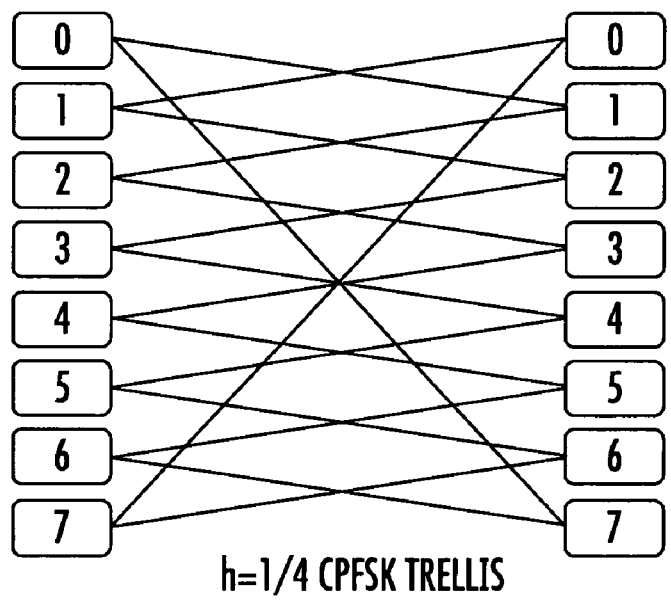
FIG. 8 is a block diagram showing a full-state trellis structure with eight states for in h=¼ binary CPFSK.

As an illustration of the set-partitioning approach, the h=¼ binary CPFSK (LREC CPM) trellis structure is drawn in FIG. 8.

The h=¼ CPFSK modulation has 8 full states. When the phase constellation is drawn with the phase positions labeled with each state (FIG. 9) it becomes apparent that a trellis structure that creates super states by combining full states 0 and 4, 1 and 5, 2 and 6, along with 3 and 7 would provide the best distance for the reduced state trellis.

This CPM trellis structure already has two special properties. The first is that, at each symbol, a valid starting state must either be odd or even with the assumption that the first starting state is the zero state. This is accomplished at the transmitter by starting the transmission at a phase value of zero degrees. The second property of this full-state trellis is that the decoder can skip the calculation of path metrics for odd or even states at the decoding of every other symbol. Thus, the optimal CPM decoder is already "reduced" to the point that it only calculates (updates) path metrics for half of the states during each decoder cycle.

Referring again to FIG. 1, the reduced-state trellis structure is illustrated. The full state labels are marked in brackets with the new, super state labels listed above each bracketed pair.

When constructing the reduced state trellis, each full state remains connected as it was in the original trellis. For this specific trellis, the characteristic properties of alternating the start state at each symbol decode cycle remains an important parameter of the decoder. A decode cycle is defined as the calculation of a full state of branch metrics from an input symbol and the update of the path metrics for all of the active states in the trellis structure.

Another enhancement required for reduced state sequence detection is the decision feedback step in the decoder. Along with path metric and traceback bits, the decoder should retain the winning full state at each super state. Since it is assumed at the beginning that the decoder starts at super state zero, the decoder state will also assume that the starting full state is zero and not four. In general, the decoder super state can be initialized to the first full state in the list for each of the reduced states (i.e. 0, 1, 2, and 3) by initializing the path metric properly.

When the decoder calculates the path metric for super state one, it will compare the zero to one transition (using the corresponding, calculated branch metric) to the metric for a state two to state one transition. The decoder will then save the full state value of one as the winning state for the next decoder cycle (in other words, it retains the phase of the survivor path). The next super state calculated at this decoder cycle will be seven (skipping the even, invalid super states). Again, since zero is the winning full state from the initial decoder cycle, the transition from zero to seven (the only valid full state) to the two to three transition (since two was initialized in the previous decoder cycle). The best path metric is chosen and the winning full state is saved along with the calculated path metric and the traceback bits in the decoder state.

Figure 10:
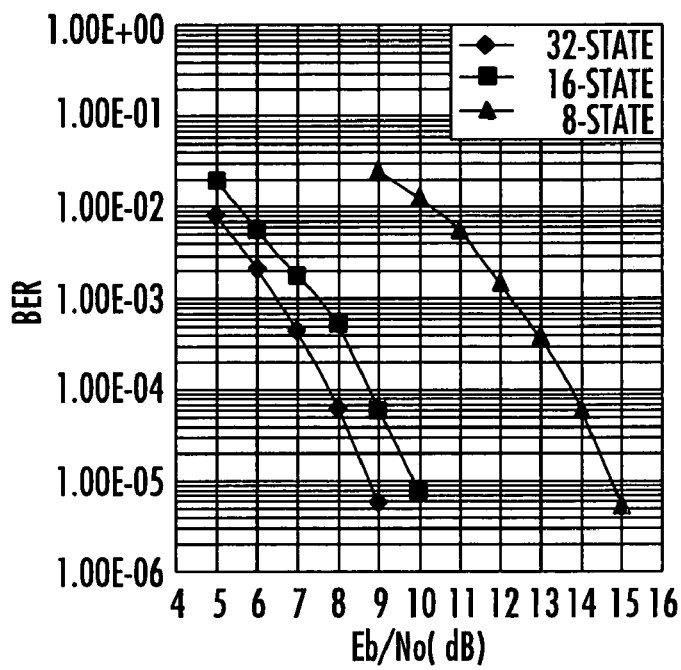
FIG. 10 is a graph showing a BER comparison of MIL-STD-188-181C, H=(4/16, 5/16) 4-ary CPFSK set-partitioning reduced-state model.

As shown in FIG. 10, the bit error rate performance degrades quickly as the number of super-states is reduced from the full-state value of 32 states to 8 super-states. Four states are active per symbol.

Figure 11:
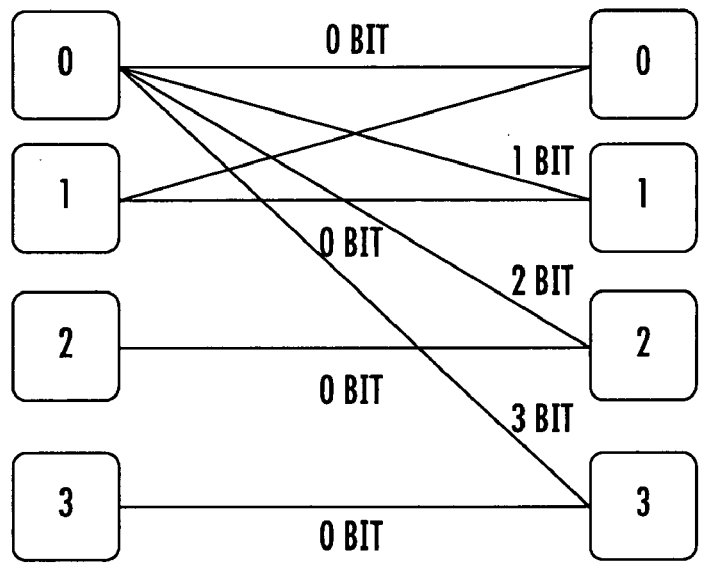
FIG. 11 is a diagram showing a four-state trellis structure.

The reduced-state maximum likelihood sequence estimator defined in Svennson has only four states. The trellis structure is shown in FIG. 11.

As shown in this diagram, a one, two, or three-valued bit causes a state transition and a zero-valued bit does not. Note that every state is connected to every other state, which is not shown on the diagram to simplify the illustration.

Using this method, the inactive states are automatically deleted from the path metric computations. This is a simple structure to implement and can be adapted to any CPFSK modulation. As with the set-partitioning approach, decision feedback is used to maintain the winning phase state for each of the super states. The decoder then calculates the path metrics for the four valid paths from the chosen, winning phase and picks a new winning path metric, which is then saved in the super state based on the branch taken during the symbol. If the branch corresponds to a 0-valued bit, then the new super state is the same as the old super state. If, however, the transition corresponds to a one, two, or three-valued bit, then the accumulated path metric is saved to that other super state.

Figure 12:
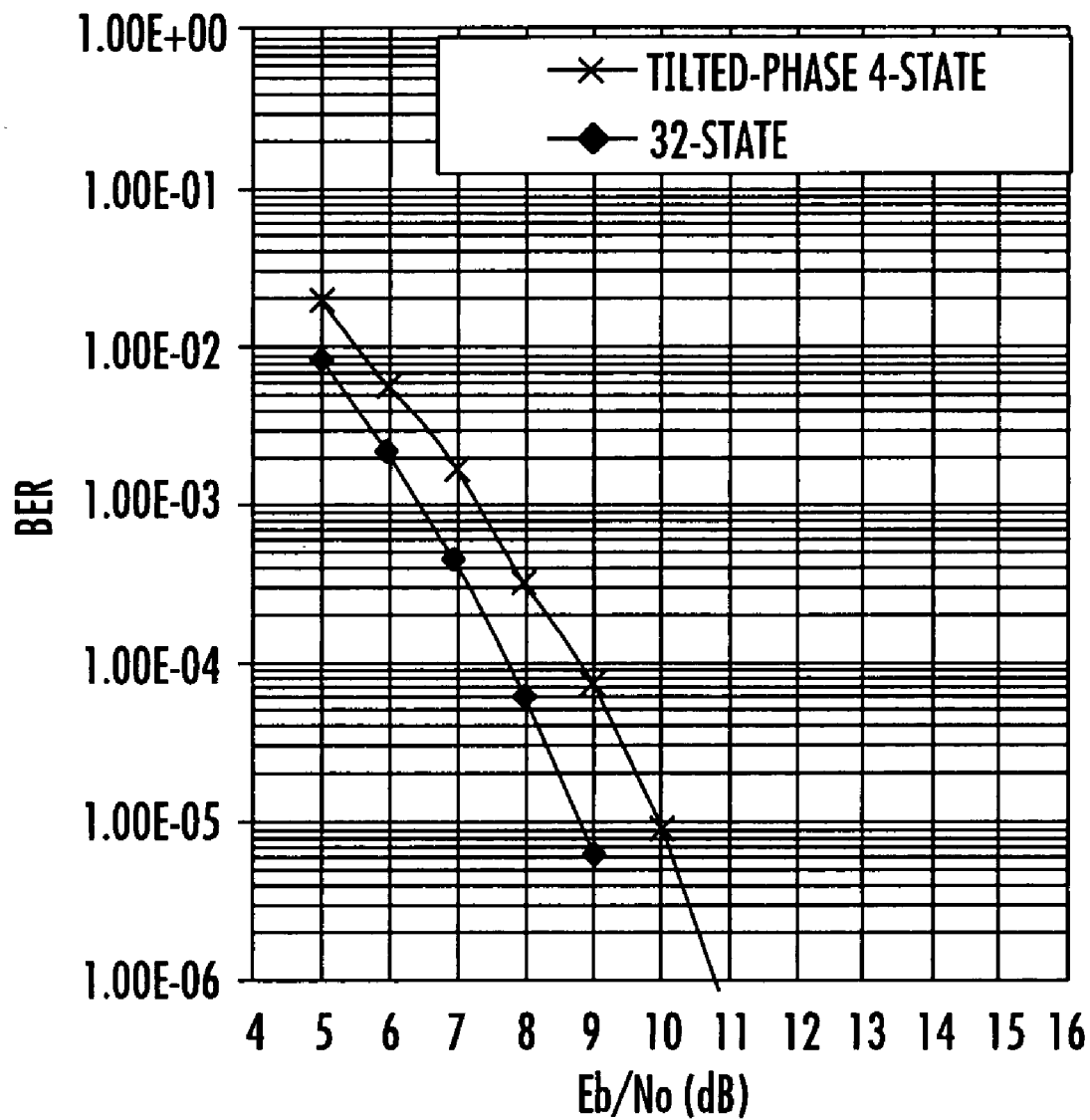
FIG. 12 is a graph showing the BER comparison of MIL-STD-188-181C, H-(4/16, 5/16) 4-ary CPFSK with tilted phase reduced-state model.

The resulting bit error rate performance is shown in FIG. 12. The BER is slightly degraded by use of the reduced-state technique.

The Continuous Phase Modulation schemes in the MIL-STD-188-181C require complex maximum likelihood decoders, which can be reduced in complexity using either of the two algorithms discussed above. The tilted-phase approach has been shown to have the best bit error rate performance while proving to be the most computationally efficient. The current MIL-STD allows for 3 dB implementation loss (for the h=4/16, 5/16 option), which could allow for a receiver to implement the reduced complexity scheme and still meet the specification.

There now follows a more detailed description of examples of reduced state techniques operable with a programmable trellis or maximum likelihood decoder as described before and used for hybrid CPM modulation, in accordance with non-limiting examples of the present invention.

Hybrid Continuous Phase Modulation (HCPM) is a variant of Continuous Phase Modulation that uses either additional Amplitude or Phase pulses to create a higher order modulation. For standard CPM, an increase in the modulation order results in the increase of the symbol alphabet and a corresponding increase in the transmit bandwidth and exponential increase in the complexity of the decoder trellis structure. Hybrid CPM however achieves higher order modulation by adding parallel branches to the base CPM trellis structure thus reducing the receiver complexity. The goal of the text that follows is to demonstrate that the techniques devised to reduce the demodulator complexity of standard modulation types like TCM and CPM can also be successfully applied to Hybrid CPM. As an example, the text provides an analysis of the power and spectral efficiency of the two hybrid CPM waveforms and gives specific examples of the application of reduced state techniques. Both set-partitioning and reduced-state sequence estimation with decision feedback techniques are analyzed and compared. The results will demonstrate that reduced-state sequence estimation can be coupled with Hybrid CPM demodulation without any loss in bit error rate performance.

Hybrid Continuous Phase Modulation can be represented with the time domain representation:

$$s(t) = \sqrt{2E/T}\, A_i(t)\cos\left(2\pi f t + 2\pi \sum_{i=0}^{n} \alpha_i h_i q_i(t - iT)\right)$$

where T is the symbol period, E is the energy per symbol, f is the carrier frequency, $A_i(t)$, $q_i(t)$, and $a_i$ are all dependent on the transmitted data, and $h_i$ is the modulation index. Unlike classic CPM modulation, hybrid CPM extends the symbol alphabet contained in $\alpha_i$ with a set of additional amplitude or phase ($A_i(t)$ or $q_i(t)$) pulses. For constant envelope HCPM, $q_i(t)$ is the phase pulse shape that contains part of the modulated bits. And for non-constant envelope hybrid CPM, $A_i(t)$ is the amplitude pulse shape that contains part of the modulated bits. In both cases, the net result is more bits per symbol.

With rectangular (linear) pulse shaping the CPM waveform is denoted as 1REC CPM or CPFSK. To this full-response signal, different amplitude pulse shapes can be applied to each CPM phase trajectory to create a non-constant envelope signal. For optimal performance, each amplitude pulse should have good cross-correlation properties and would ideally be orthogonal. A sample set of orthogonal and antipodal signals would include multiples of sinusoid signals as shown in Table 1.

TABLE I

Amplitude Pulse Shaping

| AM Bit | Amplitude Shape |
|---|---|
| 0 $A_{00}(t)$ | $-\sin(Fs/2)$ |
| 1 $A_{01}(t)$ | $\sin(Fs/2)$ |
| 2 $A_{10}(t)$ | $-\sin(Fs)$ |
| 3 $A_{11}(t)$ | $\sin(Fs)$ |

Other CPM-based amplitude pulse schemes have been described in the literature as a method of reducing the bandwidth of the transmit signal. Multi-amplitude CPM has been defined as a method to increase the modulation order of the CPM signal by allowing same-phase constellation points to have two or more amplitude positions. Multi-amplitude CPM reduces the distance between adjacent CPM constellation points and has a narrow transmit spectrum. As a result of the decreased Euclidean distance, the power efficiency of multi-amplitude CPM is impaired by the increase in constellation density. Unlike multi-amplitude CPM modulation, hybrid CPM has a the same transmit constellation as the original CPM signal and has a corresponding increase in bandwidth as a function of each additional bit added to the modulated signal. As compared to multi-amplitude CPM, the power efficiency is unaffected by increase in modulation order. Multi-Amplitude CPM is more comparable to PSK or QAM modulation schemes (and unlike HCPM) because those modulation types also increase in constellation density as a function of the order of the modulation and suffer a corresponding loss in power efficiency.

The constant envelope hybrid CPM modulation utilizes the phase pulse of the CPM signal to generate a higher level modulation. Other constant-envelope pulse-based modulation schemes have been described in the literature. Multi-pulse CPM, for example, is a generalized method that describes different phase-pulse shapes for each transmitted bit designed to provide better Euclidean distance for a given spectral mask. Unlike multi-pulse CPM, the constant envelope hybrid CPM increases the modulation order using both the standard base CPM $\alpha i$ (modulation index) and different phase pulses, $qi(t)$, for the remainder of bits per symbol being sent. The resulting signal has the same decoder trellis structure as the base CPM waveform. The additional parallel branches generated by the HCPM signal are designed in a manner that intentionally prevents an increase in trellis complexity (only the branch metric computation is affected).

Figure 7:
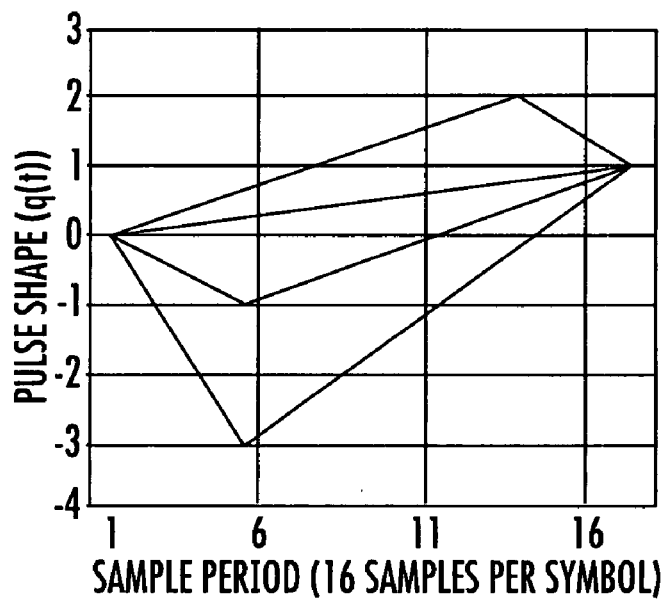
FIG. 7 is a graph showing phase pulse shapes for 16 samples per symbol.

For constant envelope Hybrid CPM, the phase pulse shape, $qi(t)$, is tailored to meet spectral or power efficiency requirements and each pulse is designed to generate a transmit symbol which is as orthogonal as possible (to other symbols in the transmit alphabet) to increase the distance properties of the branch metric computation at the decoder. An example of the possible phase-pulse shape combinations can best be demonstrated with a diagram (FIG. 7).

Each possible shape is piece-wise linear for duration of the symbol. This family of phase pulse shapes adds two bits to the CPM modulation. An $h=\frac{1}{4}$ binary CPFSK (1 REC CPM) has a full-state trellis structure as shown in FIG. 8.

Figure 9:
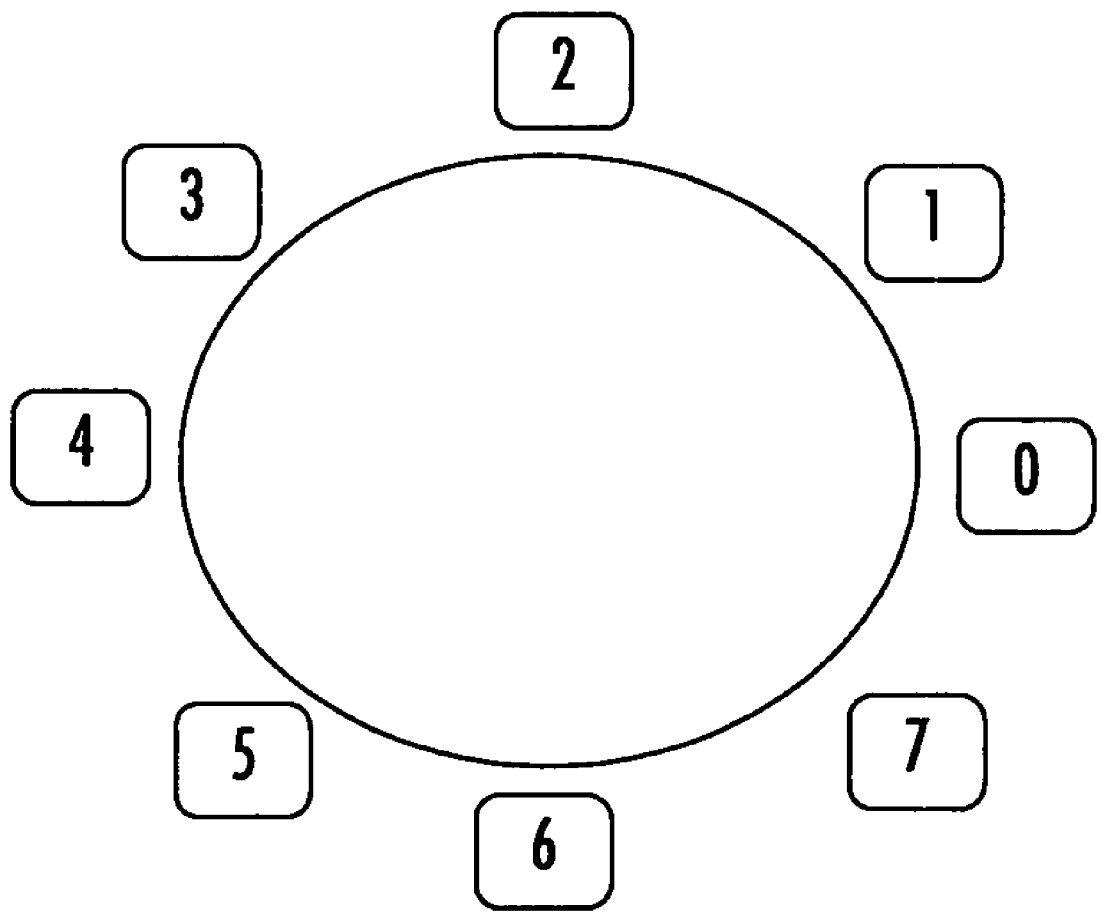
FIG. 9 is a block diagram showing a h=¼ CPFSK constellation.

The reduced state sequence detection algorithm defines two steps to the modification of the optimal, maximum likelihood decoder such as described above and set forth in the incorporated by reference Svennson and Eyuboglu articles. The first step is a set-partitioning approach to the selection of state combination. When the phase constellation is drawn with the phase positions labeled with each state as shown in FIG. 9, showing a $h=\frac{1}{4}$ CPFSK constellation. It becomes apparent that a trellis structure that creates super states by combining full states 0 and 4, 1 and 5, 2 and 6, along with 3 and 7 would provide the best distance for the reduced state trellis.

This CPM trellis structure already has two special properties. First, at each symbol, a valid starting state can be either odd or even with the assumption that the first starting state is the zero state. This can be accomplished at the transmitter by starting the transmission at a phase value of zero degrees. Second, the decoder can skip the calculation of path metrics for odd or even states at the decoding of every other symbol. The optimal CPM decoder is already "reduced" to the point that it only calculates (updates) path metrics for half of the states during each decoder cycle.

Referring again to FIG. 1, the reduced-state trellis structure is shown. As noted before, the full state labels are marked in brackets with the new, super state labels listed above each bracketed pair.

When constructing the reduced state trellis, each full state remains connected as it was in the initial trellis. For this specific trellis, the characteristic properties of alternating the start state at each symbol decode cycle remains an important parameter of the decoder. A decode cycle is defined as the calculation of a full state of branch metrics from an input symbol and the update of the path metrics for all of the active states in the trellis structure.

A second, important enhancement required for reduced state sequence detection is the decision feedback step in the decoder. Along with path metric and trace-back bits, the decoder retains the winning full state at each super state. Since it is assumed at the beginning that the decoder starts at super state zero, the decoder state will also assume that the starting full state is zero and not four. In general, the decoder super state can be initialized to the first full state in the list for each of the reduced states (i.e. 0, 1, 2, and 3) by initializing the path metric properly.

When the decoder calculates the path metric for super state one, it will compare the zero to one transition (using the corresponding, calculated branch metric) to the metric for a state two to state one transition. The decoder saves the full state value of one as the winning state for the next decoder cycle. The next super state calculated at this decoder cycle will be seven (skipping the even, invalid super states). Again, since zero is the winning full state from the initial decoder cycle, the transition from zero to seven (the only valid full state) to the two to three (since two was initialized in the previous decoder cycle) and the winning full state saved along with the calculated path metric and the trace-back bits in the decoder state.

Hybrid CPM Modulation adds parallel branches to each transition in the trellis structure. The maximum likelihood decoder must determine, at each symbol, which parallel branch has the best distance (the best numerical branch metric value) and uses that value for the current state-to-state transition. Standard CPM complexity increases with the modulation level and h-value. Hybrid CPM does not add states or transition branches to the trellis structure. The complexity of the Hybrid CPM modulation has a proportional increase based on the number of branch metrics required for each bit added to the modulation level.

Figure 13:
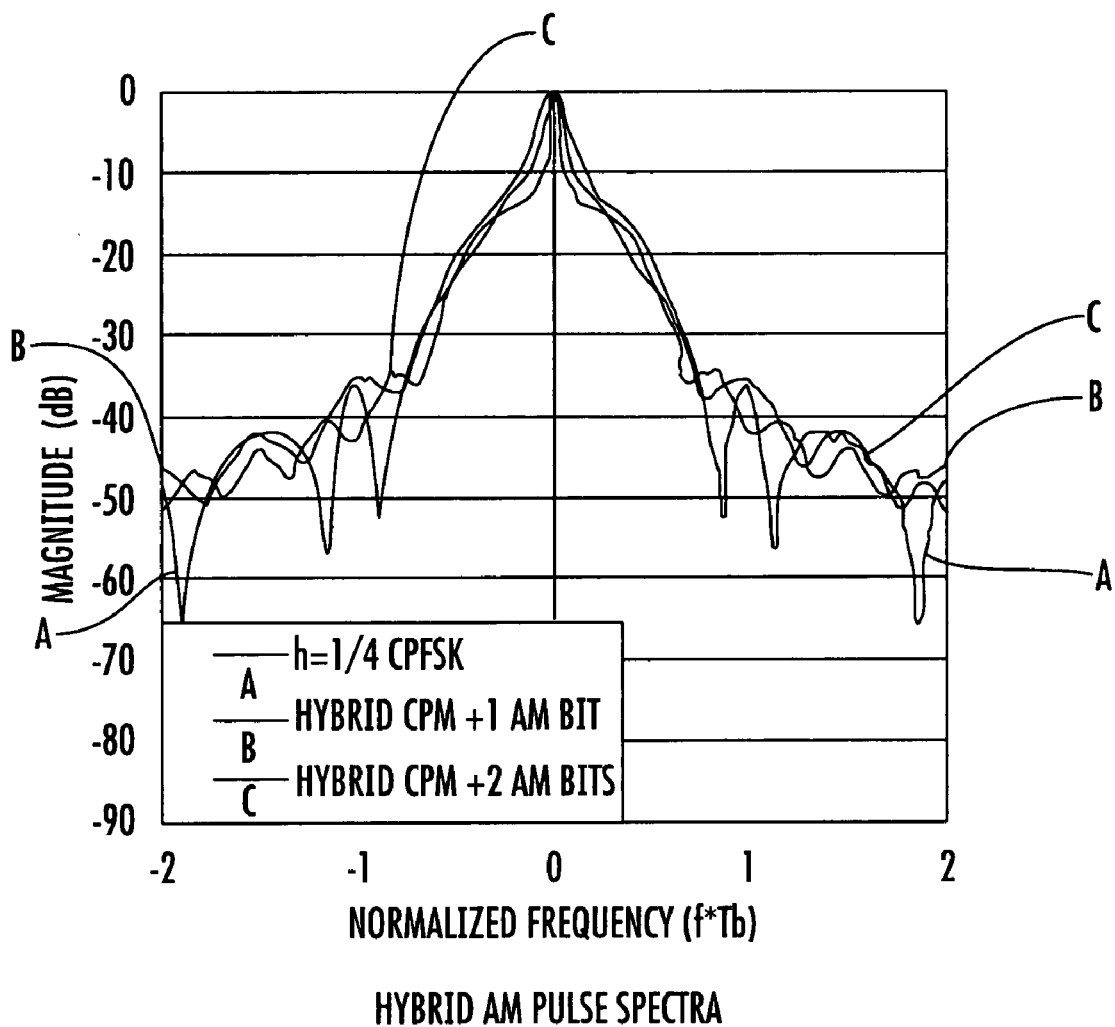
FIG. 13 is a graph showing a hybrid AM pulse spectra.

Another characteristic feature of hybrid CPM is the ability to tailor the transmit spectrum to meet channel requirements. As shown in the example in Table 1 above, a single bit can be added to the CPFSK modulation using a ½ sine wave amplitude shape. If two bits are added, a full sine wave amplitude pulse is added to the existing sine wave to form four antipodal pulse shapes. The resulting spectra are shown in FIG. 13.

Each spectrum has been normalized to the bit rate rather than the symbol rate to demonstrate that the characteristic bandwidth of the CPFSK signal has been preserved. In fact, the bandwidth is increased by the number of bits per symbol in the Hybrid CPM waveform. The resulting 90% bandwidth values are 0.68, 2.1, and 3.4 times the symbol rate for the CPFSK, Hybrid CPM with 1 AM Bit, and Hybrid CPM with 2 AM Bits respectively.

Figure 14:
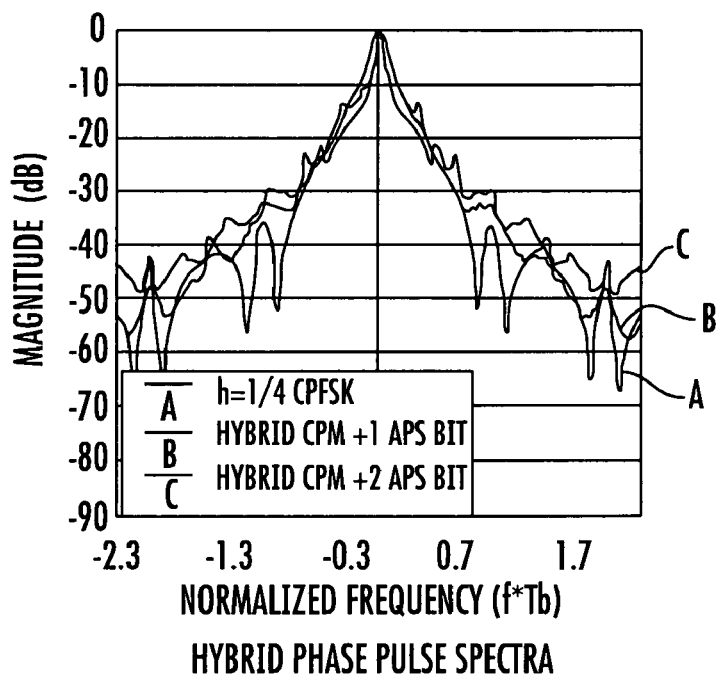
FIG. 14 is a graph showing a hybrid phase pulse spectra.

The amplitude pulse shaped Hybrid CPM has the spectral properties as shown in FIG. 14. As with the phase pulse shaping, the amplitude pulse shapes add spectral content to the signal. Each spectrum shown in FIG. 11 has been normalized to the bit rate of the modulation. Without normalization, the resulting 90% bandwidth is 0.68, 1.5, and 3.4 times the symbol rate.

Figure 15:
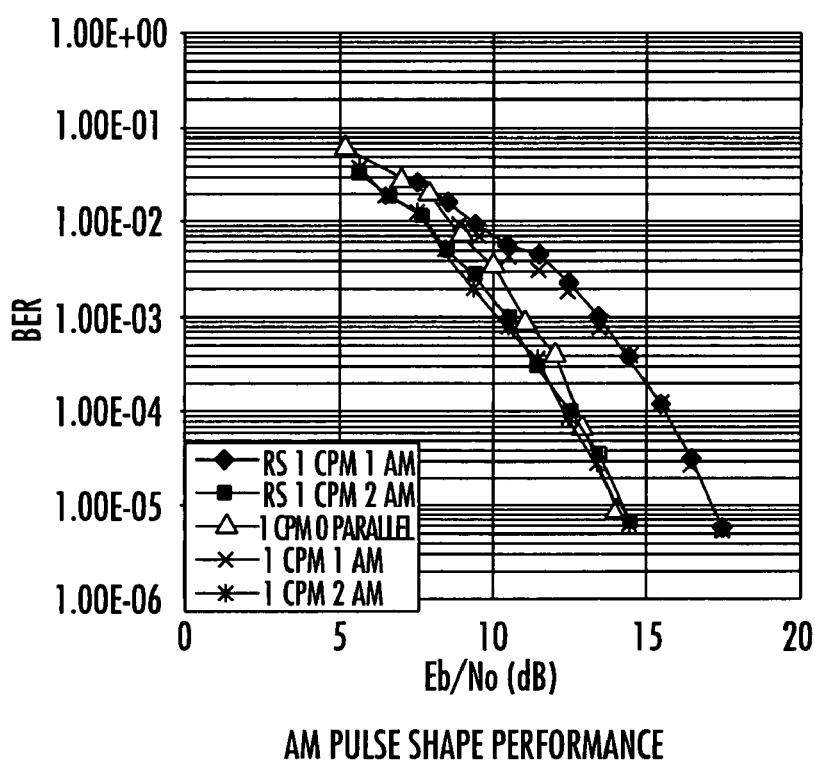
FIG. 15 is a graph showing an AM pulse shape performance.

An intuitive expectation of a waveform that increases bandwidth as a function of modulation level is that the distance property of the signal must be increasing and the corresponding power efficiency is improved. This is equivalent to a PSK signal that has been spread by an orthogonal code. The resulting signal bandwidth increases by the code rate and the power efficiency is the same as a standard PSK modulation. In the case of pulse shapes chosen as examples, some provide more or less bandwidth expansion and correspondingly more or less Eb/No improvement. As shown in FIG. 15, the amplitude pulse shaped Hybrid CPM has different performance levels for each pulse shape.

The abbreviation "IRS" is used to represent the reduced state version of each of the Hybrid CPM examples. As shown in FIG. 15, the higher throughput, 3 bits per symbol, Hybrid CPM modulation, has better power efficiency than the 2 bits per symbol version. It has been verified that by selecting the wider bandwidth, i.e., full sine wave amplitude pulse shapes, the Eb/No performance was improved for the 2 bit per symbol Hybrid CPM.

The power efficiency of the 3 bit per symbol Hybrid CPM signal matches the standard $h=\frac{1}{4}$ CPFSK modulation. Those skilled in the art understand that it is possible to increase the modulation level of the CPFSK signal. The decoder complexity can increase with the modulation level. The number of states in the CPM trellis can be the same for the multi-level as for the binary modulation, but each state has an increasing number of branches as the order of the modulation increases. The decoder calculates the metric for each of these transition branches as the sum of the branch metric and the path metric of its associated state. If the transition branch is not chosen, this is a wasted operation. In the case of the parallel branches used by Hybrid CPM, the decoder simply compares branch metrics of the two parallel paths without the addition of the path metric. Depending on the number of states and modulation order, the extra addition of the path metric increases the relative complexity of the standard CPM modulation relative to the Hybrid CPM modulation.

Figure 16:
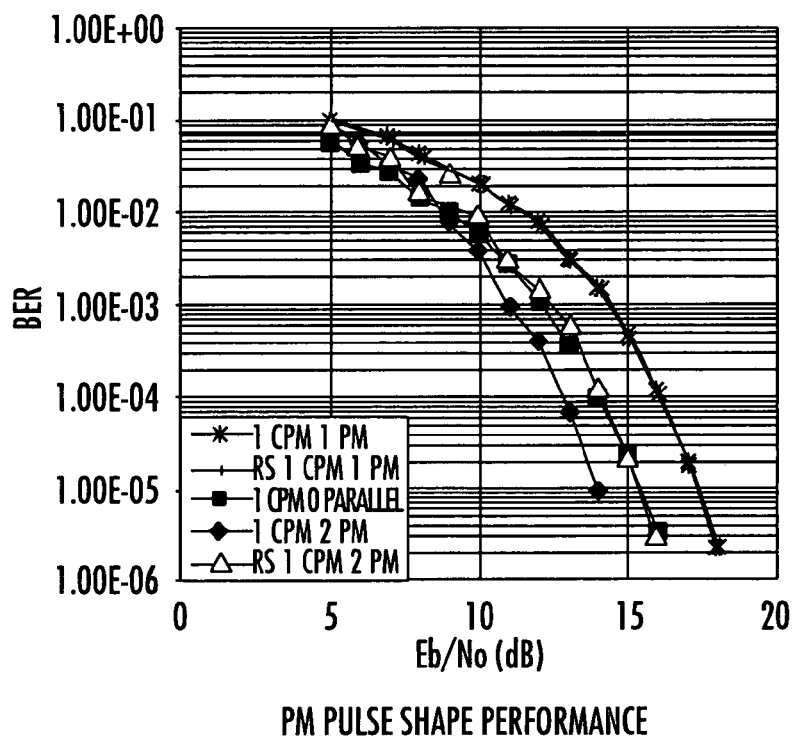
FIG. 16 is a graph showing a PM pulse shape performance.

The phase pulse shaped Hybrid CPM modulation bit error rate curves are shown in FIG. 16. As with the amplitude pulse shaping, the phase pulse shaping performance is variable. The 3 bit per symbol modulation outperforms the 2 bit per symbol version. Again, the difference is in the choice of phase pulse shapes. If the higher-valued pulse shaping was chosen for the 2 bit per symbol Hybrid CPM, the power efficiency would be improved.

Figure 17:
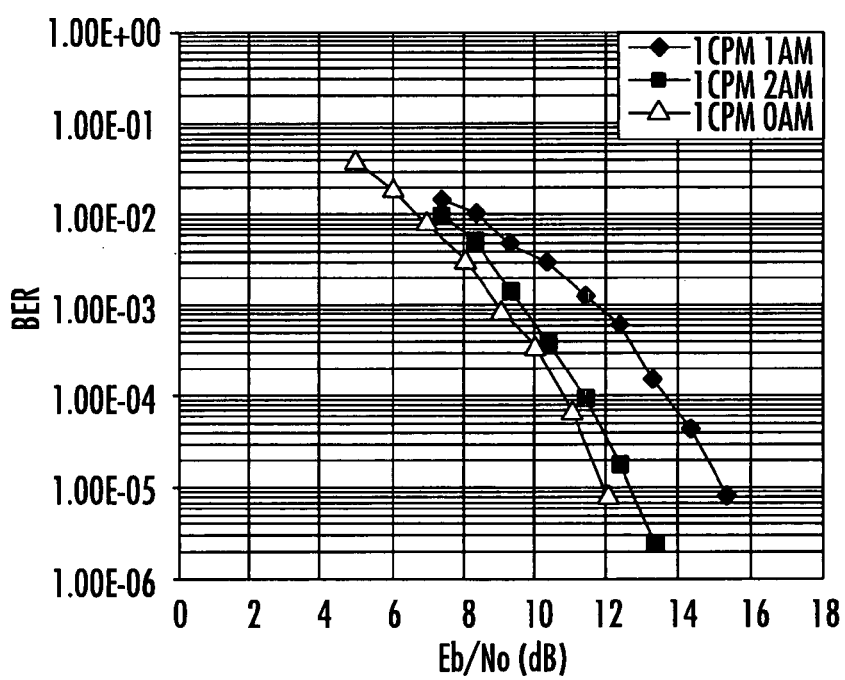
FIG. 17 is a graph showing a reduced state h=⅓ amplitude shaped HCPM bit error rate, in accordance with a non-limiting example of the present invention.

The resulting bit error rate curve for the 2-state reduced state $h=\frac{1}{3}$ CPFSK and HCPM with amplitude shaping is shown in FIG. 17.

Figure 18:
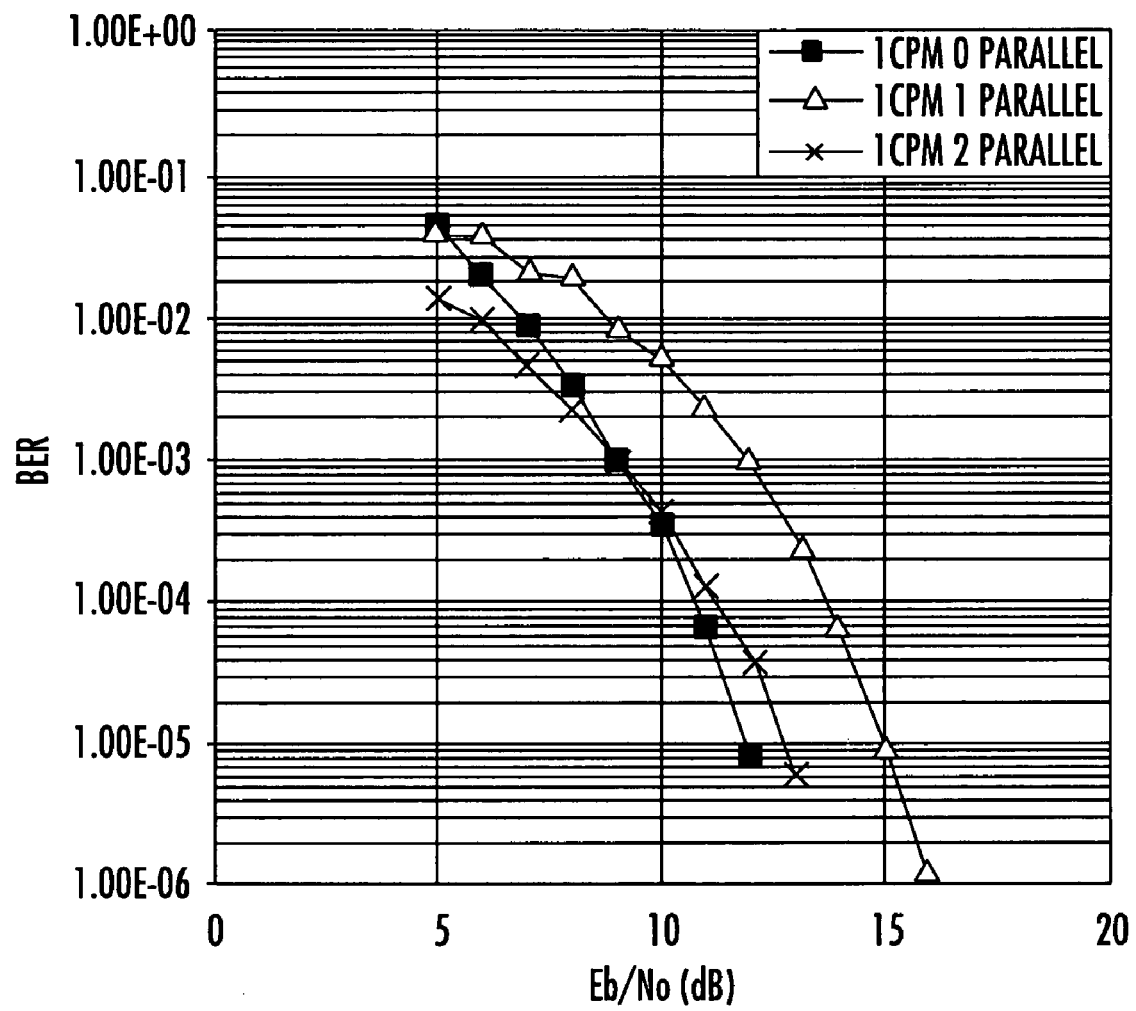
FIG. 18 is a graph showing a reduced state h=⅓ phase shaped HCPM bit error rate, in accordance with a non-limiting example of the present invention.

The bit error rate curve for the 2-state reduced state $h=\frac{1}{3}$ CPFSK with HCPM with phase pulse shaping is shown in FIG. 18.

For increased modulation order (4-ary, 8-ary, etc.). The reduced state trellis structure increases proportionally. For HCPM, however, the trellis structure of the original CPM signal is maintained. The trellis structure has parallel branches, which do not modify the decision feedback or path metric storage. The best parallel path is chosen for each branch and then used as the branch metric for that super state.

It is clear from the power efficiency performance curves that the pairing of reduced-state sequence detection with Hybrid CPM modulation effectively extends the range of usefulness of the waveform. Increasing the throughput of a CPM signal with the addition of the orthogonal amplitude or phase modulation does not increase the decoder complexity as much as adding more transition branches to each node. With the addition of reduced state sequence detection, additional power efficiency performance can be obtained without the corresponding increase in decoder complexity through the use of a base CPM trellis structure with a larger number of full states.

Each possible pulse shape is piece-wise linear for the duration of the symbol. This family of phase pulse shapes adds 2 bits to the CPM modulation.

As an illustration of both types of hybrid CPM modulation, a common base trellis structure was selected. An $h=\frac{1}{4}$ binary CPFSK (LREC CPM) has a full-state trellis structure with eight states as shown in FIG. 5 showing a $h=\frac{1}{4}$ CPFSK trellis.

This application is related to copending patent applications entitled, "REDUCED STATE TRELLIS DECODER USING PROGRAMMABLE TRELLIS PARAMETERS," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A decoder comprising:
   at least one programming input for a plurality of programmable reduced-state trellis parameters; and
   a programmable device connected to the at least one programming input and implementing a reduced-state maximum likelihood decoder comprising at least one reduced-state trellis structure based upon the plurality of programmable reduced-state trellis parameters and that is operable for processing a continuous phase modulated (CPM) signal and returning up to N bits that were transmitted based on a maximum likelihood and current winning super-state and corresponding survivor full-state, wherein said programmable device calculates the path metrics for every super-state and determines a best path based on the programmable reduced-state trellis parameters.

2. The decoder according to claim 1, wherein said programmable reduced-state trellis parameters are comprised of one of at least the number of super-states, the number of full-states, the number of branches per super-state, a reverse super-state trellis table, a decoder super-state survivor as a full-state, a forward full-state table, a full-state to super-state mapping table, decoder super-state path metric and decoder super-state traceback array.

3. The decoder according to claim 2, wherein all programmable parameters are integers.

4. The decoder according to claim 2, wherein the decoder state structure comprises a path metric per super-state, a traceback array per super-state, and a survivor full-state per super-state.

5. The programmable decoder according to claim 2, wherein the reduced-state trellis structure is formed from an Ungerboeck-Style set-partitioning algorithm.

6. The programmable decoder according to claim 2, wherein the reduced-state trellis structure is formed from a two-state Svensson-Style structure.

7. The programmable decoder according to claim 2, wherein the reduced-state trellis structure is formed from a M-state Svensson-style structure.

8. The programmable decoder according to claim 1, wherein the reduced-state maximum likelihood decoder further comprises a decoder state structure that contains path metrics and a full decoder state used for decision feedback.

9. The programmable decoder according to claim 1, wherein the reduced-state maximum likelihood decoder further comprises a Forward Trellis structure operative for indicating which full decoder state from a decision feedback is connected to a next full decoder state for any given symbol.

10. The programmable decoder according to claim 1, and further comprising at least one output connected to said programmable device for outputting decoded bits with multiple bits per output.

11. The programmable decoder according to claim 8, wherein the at least one output is operative for outputting a full traceback of decoded bits for a best path.

12. A decoder comprising:
at least one programming input for a plurality of programmable reduced-state trellis parameters; and
a programmable device connected to the at least one programming input and implementing a reduced-state maximum likelihood decoder comprising at least one reduced-state trellis structure based upon the plurality of programmable reduced-state trellis parameters and that is operable for processing a continuous-phase modulated (CPM) signal and returning N bits that were transmitted based on a maximum likelihood and current winning super-state and corresponding survivor full-state, wherein said programmable device calculates the path metrics for every super state and determines a best path based on a forward state trellis when a winning full-state is received and full-states are combined into a super-state based on the programmable reduced-state trellis parameters.

13. The decoder according to claim 12, wherein said programmable reduced-state trellis parameters comprise one of at least the number of super-states, the number of full-states, the number of branches per super-state, a reverse super-state trellis table, a decoder super-state survivor as a full-state, a forward full-state table, a full-state to super-state mapping table, decoder super-state path metric and decoder super-state traceback array.

14. The decoder according to claim 13, wherein the number of super states, full states and branches per node comprise an integer.

15. The decoder according to claim 13, wherein the decoder state structure comprises path metrics, full decoder state used for decision feedback and traceback array.

16. The programmable decoder according to claim 12, wherein the reduced-state maximum likelihood decoder comprises a Forward full-state Trellis structure operative for indicating which full decoder state from a decision feedback is connected to a next full decoder state for any given symbol.

17. The programmable decoder according to claim 12, and further comprising at least one output connected to said programmable device for outputting decoded bits with multiple bits per output.

18. The programmable decoder according to claim 17, wherein the at least one output is operative for outputting a full traceback of all decoded bits for the current best path metric.

19. A method of implementing a decoder comprising:
inputting a plurality of programmable reduced-state trellis parameters; and
implementing within a programming device a reduced-state maximum likelihood decoder comprising at least one reduced state trellis structure based upon the plurality of programmable trellis parameters and processing a continuous phase modulated (CPM) signal and returning N bits that were transmitted based on a maximum likelihood and current winning reduced-state, calculating the path metrics for every super-state and determining a best path based on the programmable reduced-state trellis parameters.

20. The method according to claim 19, which further comprises demodulating within the programming device waveforms with memory.

21. The method according to claim 19, which further comprises forming a decoder state structure which contains path metrics, a surviving full-state used for decision feedback and a traceback array.

22. The method according to claim 19, which further comprises forming a Forward Trellis structure operative for indicating which surviving full decoder state from a decision feedback is connected to a next full decoder state for any given symbol.

23. The programmable decoder according to claim 19, wherein the reduced-state trellis structure is formed from an Ungerboeck-Style set-partitioning algorithm.

24. The programmable decoder according to claim 19, wherein the reduced-state trellis structure is formed from a two-state Svensson-Style structure.

25. The programmable decoder according to claim 19, wherein the reduced-state trellis structure is formed from a M-state Svensson-style structure.

26. A decoder comprising:
at least one programming input for a plurality of programmable reduced-state trellis parameters; and
a programmable device connected to the at least one programming input and implementing a reduced-state maximum likelihood decoder that is operable for processing a continuous phase modulated (CPM) signal and returning up to N bits that were transmitted based on a maximum likelihood and current winning super-state and corresponding survivor full-state, wherein said programmable device calculates the path metrics for every super-state and determines a best path based on the reduced-state trellis parameters, wherein said programmable reduced-state trellis parameters are comprised of one of at least the number of super-states, the number of full-states, the number of branches per super-state, a reverse super-state trellis table, a decoder super-state survivor as a full-state, a forward full-state table, a full-state to super-state mapping table, decoder super-state path metric and decoder super-state traceback array.

27. A decoder comprising:
at least one programming input for a plurality of programmable reduced-state trellis parameters; and a programmable device connected to the at least one programming input and implementing a reduced-state maximum likelihood decoder that is operable for processing a continuous-phase modulated (CPM) signal and returning N bits that were transmitted based on a maximum likelihood and current winning super-state and corresponding survivor full-state, wherein said programmable device calculates the path metrics for every super state and determines a best path based on a forward state trellis when a winning full-state is received and full-states are combined into a super-state based on the reduced-state trellis parameters, wherein said programmable reduced-state trellis parameters comprise one of at least the number of super-states, the number of full-states, the number of branches per super-state, a reverse super-state trellis table, a decoder super-state survivor as a full-state, a forward full-state table, a full-state to super-state mapping table, decoder super-state path metric and decoder super-state traceback array.

28. A method of implementing a decoder comprising:

inputting a plurality of programmable reduced-state trellis parameters;

processing within a programming device a continuous phase modulated (CPM) signal and returning N bits that were transmitted based on a maximum likelihood and current winning reduced-state, calculating the path metrics for every super-state and determining a best path based on the reduced-state trellis parameters; and forming a Forward Trellis structure operative for indicating which surviving full decoder state from a decision feedback is connected to a next full decoder state for any given symbol.

* * * * *